(12) United States Patent
Heath et al.

(10) Patent No.: US 7,569,877 B2
(45) Date of Patent: Aug. 4, 2009

(54) SYSTEM AND METHOD BASED ON FIELD-EFFECT TRANSISTORS FOR ADDRESSING NANOMETER-SCALE DEVICES

(75) Inventors: James R. Heath, South Pasadena, CA (US); Yi Luo, Pasadena, CA (US); Rob Beckman, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 741 days.

(21) Appl. No.: 11/361,120

(22) Filed: Feb. 24, 2006

(65) Prior Publication Data

US 2006/0273462 A1 Dec. 7, 2006

Related U.S. Application Data

(62) Division of application No. 10/875,057, filed on Jun. 22, 2004, now Pat. No. 7,169,696.

(60) Provisional application No. 60/480,888, filed on Jun. 24, 2003.

(51) Int. Cl.
- *H01L 27/108* (2006.01)
- *H01L 29/94* (2006.01)
- *H01L 29/76* (2006.01)
- *H01L 31/119* (2006.01)

(52) U.S. Cl. .............. 257/296; 257/414; 257/421; 257/422; 257/E23.019; 257/E23.024

(58) Field of Classification Search ............... None
See application file for complete search history.

(56) References Cited

U.S. PATENT DOCUMENTS 6,225,236 B1 * 5/2001 Nishimoto et al. .......... 438/778
6,828,639 B2 * 12/2004 Nejad et al. ................. 257/414

* cited by examiner

*Primary Examiner*—Zandra V. Smith
*Assistant Examiner*—Khanh B Duong
(74) *Attorney, Agent, or Firm*—Townsend and Townsend and Crew LLP

(57) ABSTRACT

A system and method for selecting nanometer-scaled devices. The method includes a plurality of semiconductor wires. Two adjacent semiconductor wires of the plurality of semiconductor wires are associated with a separation smaller than or equal to 100 nm. Additionally, the system includes a plurality of address lines. Each of the plurality of address lines includes a gate region and an inactive region and intersects the plurality of semiconductor wires at a plurality of intersections. The plurality of intersections includes a first intersection and second intersection. The first intersection is associated with the gate region, and the second intersection is associated with the inactive region.

15 Claims, 17 Drawing Sheets

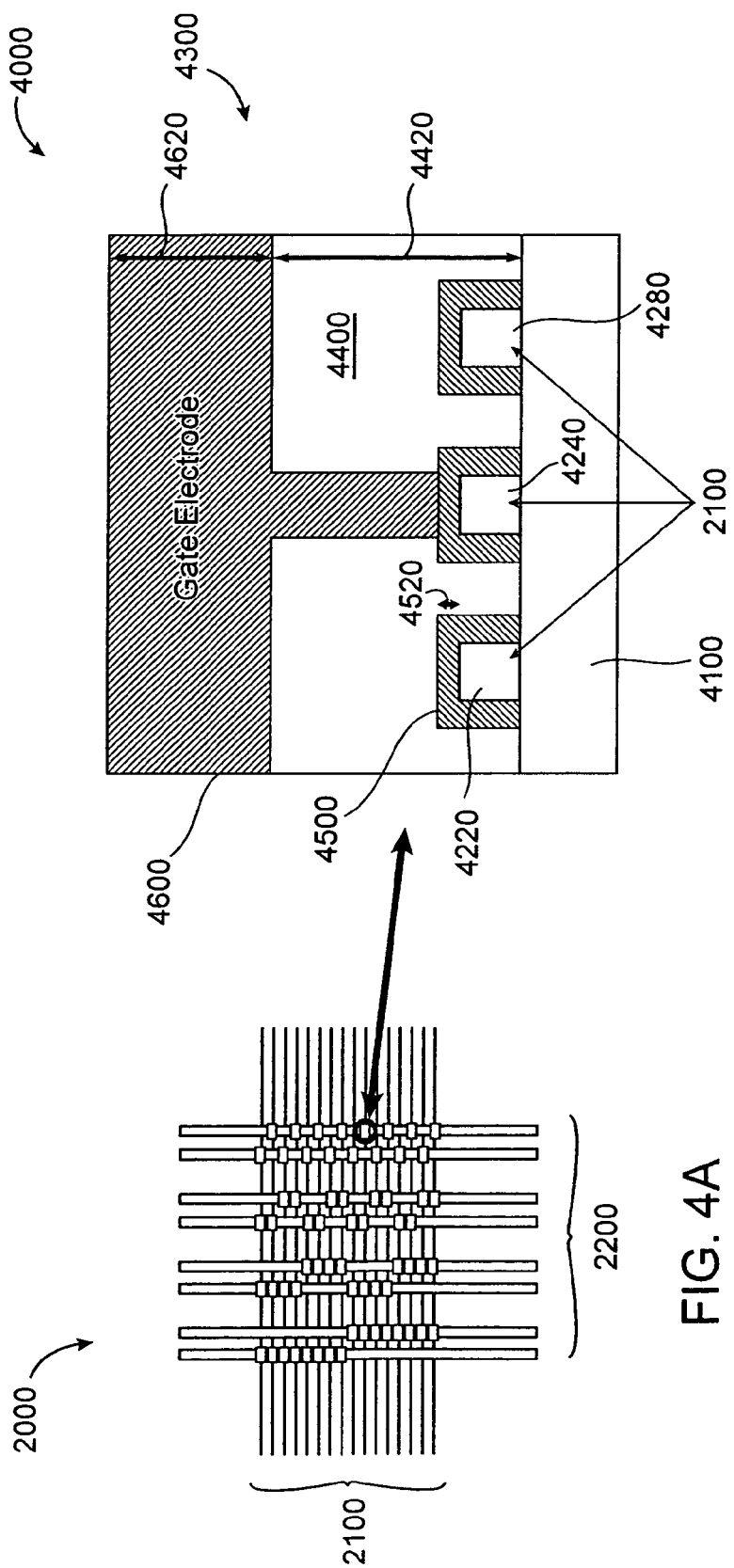

SYSTEM AND METHOD BASED ON FIELD-EFFECT TRANSISTORS FOR ADDRESSING NANOMETER-SCALE DEVICES

CROSS-REFERENCES TO RELATED APPLICATIONS

This application is a division of U.S. application Ser. No. 10/875,057 filed Jun. 22, 2004, which claims priority to U.S. Provisional No. 60/480,888 filed Jun. 24, 2003. Both applications are incorporated by reference herein.

STATEMENT AS TO RIGHTS TO INVENTIONS MADE UNDER FEDERALLY SPONSORED RESEARCH OR DEVELOPMENT

Work described herein has been supported, in part, by DARPA Grant No. MDA972-01-03-0005. The United States Government may therefore have certain rights in the invention.

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention relates generally to the field of nanotechnology. More specifically, the invention provides a method and system based on field effect transistors for addressing nanometer-scale devices. Merely by way of example, the invention has been applied to nanometer-scale wires, but it would be recognized that the invention has a much broader range of applicability.

In the field of nanotechnology, it is important to bridge the length scales between the ultra-high density patterns achievable through nanometer-dimension patterning techniques, and the patterns that are achievable using lithographic patterning techniques. The nanometer-scale patterning techniques may use self-assembly processes and/or non-lithographic processes. For example, aligned circuits include nanowires whose diameters are as small as 8 nanometers, and the separations between adjacent nanowires are 16 nm. In contrast, the high resolution lithography technique such as electron-beam lithography (EBL) can make small metal islands as small as 8 nanometers, but those features are usually separated by 60 nanometers or so. For straight and aligned wires, EBL can provide patterns with wire diameters ranging from 20 to 30 nanometers and wire pitches ranging from 60 to 80 nanometers. The wire pitches are related to the separations between adjacent wires. Hence, both the wire diameters and wire pitches from EBL are significantly larger than the diameters and separations of the nanowires.

To bridge the length scales between the nanometer-dimension patterning techniques and lithographic patterning techniques, diode-based binary tree multiplexers-may be used. FIG. 1 is a simplified conventional binary tree multiplexer. The binary tree multiplexer 100 includes nanowires 110 and address wires 120. For example, the address wires 120 are patterned with lithographic techniques and connected with the nanowires 110 with diodes or switches that change between two resistance states includes one of high resistance and the other one of low-resistance. The inputs of the address wires 120 act as the inputs to a logical AND gate. As shown in FIG. 1, 16 nanowires 110 are addressed using 8 address wires 120. This corresponds to $2^4$ nanowires being addressed with 2×4 address wires. Specifically, two address wires 130 are connected to different groups of 8 adjacent nanowires, another two address wires 132 are connected to different groups of 4 adjacent nanowires, yet another two address wires 134 are connected to different groups of 2 adjacent nanowires, and yet another two address wires 136 are connected to different individual nanowires. The topmost nanowire and the bottommost nanowire are considered to be adjacent. Each of the address wires 110 is connected to a different half of the nanowires 120. For example, if the four address wires 140 are grounded, and a voltage is applied to the other four address wires 150, only one nanowire 160 should be connected to all four address wires 150. Hence the nanowire 160 is the wire that is addressed. The binary tree multiplexer 100 may consume significant power and involve complicated fabrication processes.

Hence it is desirable to improve techniques for addressing nanometer-scale devices.

BRIEF SUMMARY OF THE INVENTION

The present invention relates generally to the field of nanotechnology. More specifically, the invention provides a method and system based on field effect transistors for addressing nanometer-scale devices. Merely by way of example, the invention has been applied to nanometer-scale wires, but it would be recognized that the invention has a much broader range of applicability.

According to an embodiment of the present invention, a system for selecting one wire from a plurality of wires includes a plurality of semiconductor wires. Two adjacent semiconductor wires of the plurality of semiconductor wires are associated with a separation smaller than or equal to 100 nm. Additionally, the system includes a plurality of address lines. Each of the plurality of address lines includes a gate region and an inactive region and intersects the plurality of semiconductor wires at a plurality of intersections. The plurality of intersections includes a first intersection and second intersection. The first intersection is associated with the gate region, and the second intersection is associated with the inactive region. At the first intersection, the each of the plurality of address lines is separated from a first semiconductor wire by a first dielectric layer, and at the second intersection, the each of the plurality of address lines is separated from a second semiconductor wire by a second dielectric layer. The each of the plurality of address lines is free from any gate region associated with a dimension smaller than the separation, and the dimension is related to a first direction of the each of the plurality of address lines.

According to another embodiment, a method for making a system for selecting one wire from a plurality of wires includes providing a plurality of semiconductor wires. Two adjacent semiconductor wires of the plurality of semiconductor wires are associated with a separation smaller than or equal to 100 nm. Additionally, the method includes depositing a first dielectric layer on at least the plurality of semiconductor wires, and patterning the first dielectric layer to expose at least a first part of a first semiconductor wire and a second part of a second semiconductor wire of the plurality of semiconductor wires. Moreover, the method includes depositing a second dielectric layer on the patterned first dielectric layer and at least the first part of the first semiconductor wire and the second part of the second semiconductor wire, and depositing a metal layer on the second dielectric layer. The patterned first dielectric layer, the second metal layer, and the metal layer are associated with an address line including a gate region and an inactive region. The gate region is on a first part of the second dielectric material located directly on at least the first part of the first semiconductor wire and the second part of the second semiconductor wire.

According to yet another embodiment, a method for selecting one wire from a plurality of wires includes providing a system including a plurality of semiconductor wires and a plurality of address lines, applying a first voltage to the plurality of semiconductor wires, applying a second voltage to a first half of the plurality of address lines, and applying a third voltage to a second half of the plurality of address lines. Additionally, the method includes obtaining a plurality of currents associated with the plurality of semiconductor wires related to the second voltage and the third voltage, processing information associated with the plurality of currents, and determining a first semiconductor wire based on information associated with the plurality of currents. Two adjacent semiconductor wires of the plurality of semiconductor wires are associated with a separation smaller than or equal to 100 nm. Each of the plurality of address lines intersects the plurality of semiconductor wires at a plurality of intersections. At each of the plurality of intersections, the each of the plurality of address lines is separated from a corresponding semiconductor wire of the plurality of semiconductor wires by a dielectric layer.

Many benefits are achieved by way of the present invention over conventional techniques. For example, some embodiments of the present invention provide a system and method for matching the nanometer-dimension patterning techniques and lithographic patterning techniques and for addressing each of the individual nanostructures. For example, the lithographic patterning techniques may use an optical beam such as in the ultraviolet range or the far-ultraviolet range or use an electron beam. Certain embodiments of the present invention can select and address a signal wire whose cross-section area is smaller than the resolution of lithographic techniques. Some embodiments of the present invention can select and address a signal wire from a plurality of signal wires, whose pitch is smaller than the resolution of lithographic techniques.

Certain embodiments of the present invention improves the density of an addressing system. The addressing structures patterned with lithographic techniques usually has a density lower than that of the nanostructures. For example, the addressing structures include address lines with gate regions and inactive regions. To improve overall density, it is desirable to reduce the number of addressing structures for a given number of nanostructures. For example, $2^n$ nanostructures can be individually addressed by approximately n or 2×n addressing lines. n is a positive integer. Some embodiments of the present invention improve tolerance of manufacturing defects. The addressing system does not require manufacturing precision at the level of nanowires. For example, the addressing lines are much larger and spaced farther apart than the nanometer-scale wires. In another example, the spacing between the gate regions of the addressing lines is much larger than the spacing between the nanowires. In yet another example, the smallest gate region covers more than one nanowire.

Some embodiments of the present invention significantly increase the ease of fabrication. A predetermined registration is not required between a given gain region and a give nanowire. For example, the pattern of gain regions for an addressing line continues beyond the edges of the array of nanowires. Certain embodiments of the present invention reduce power consumption. Field effect transistors formed between the gate regions and the nanowires usually do not allow substantial electrical current between the addressing lines and the nanowires except limited leakage current. The reduction in power consumption also reduces heat generation. Additionally, the field effect transistors can serve as gain elements. Some embodiments of the present invention provides an addressing system and method for a large number of nanometer-scale devices without consuming an unacceptable level of power. Certain embodiments of the present invention can bring a nanowire to high resistivity state and low resistivity state depending upon applied gate voltage. Certain embodiments of the present invention improve etching selectivity between $SiO_2$ and Si. The etching rate of $SiO_2$ is much higher than that of Si. Some embodiments of the present invention can select and address an array of semiconductor wires on an insulating substrate.

Depending upon embodiment, one or more of these benefits may be achieved. These benefits and various additional objects, features and advantages of the present invention can be fully appreciated with reference to the detailed description and accompanying drawings that follow.

BRIEF DESCRIPTION OF THE DRAWINGS

FIG. 4A is a simplified system for addressing devices according to yet another embodiment of the present invention;

FIG. 4B shows simplified intersections between address lines and devices according to another embodiment of the present invention;

DETAILED DESCRIPTION OF THE INVENTION

The present invention relates generally to the field of nanotechnology. More specifically, the invention provides a method and system based on field effect transistors for addressing nanometer-scale devices. Merely by way of example, the invention has been applied to nanometer-scale wires, but it would be recognized that the invention has a much broader range of applicability.

System for Addressing Devices

Figure 1:
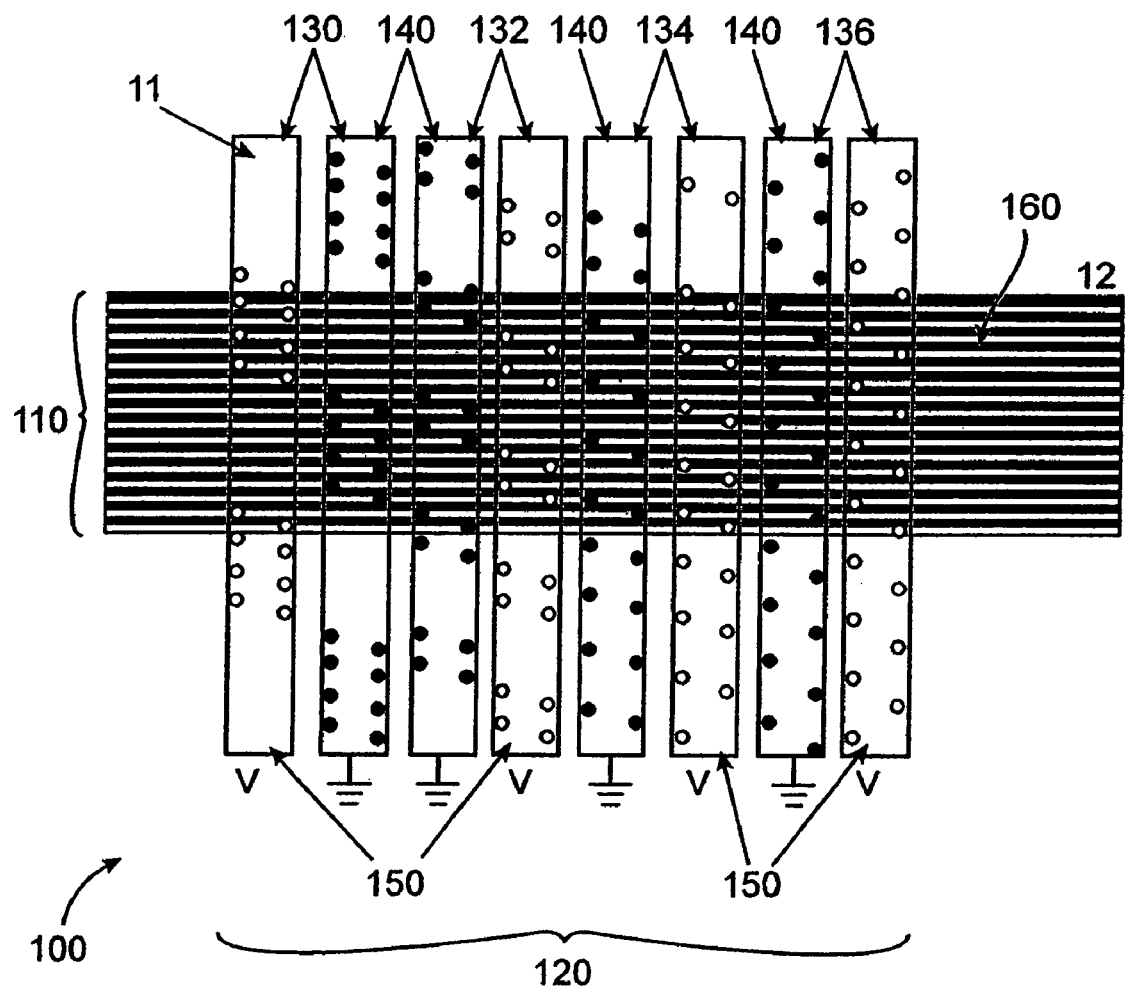
FIG. 1 is a simplified conventional binary tree multiplexer.
Figure 2:
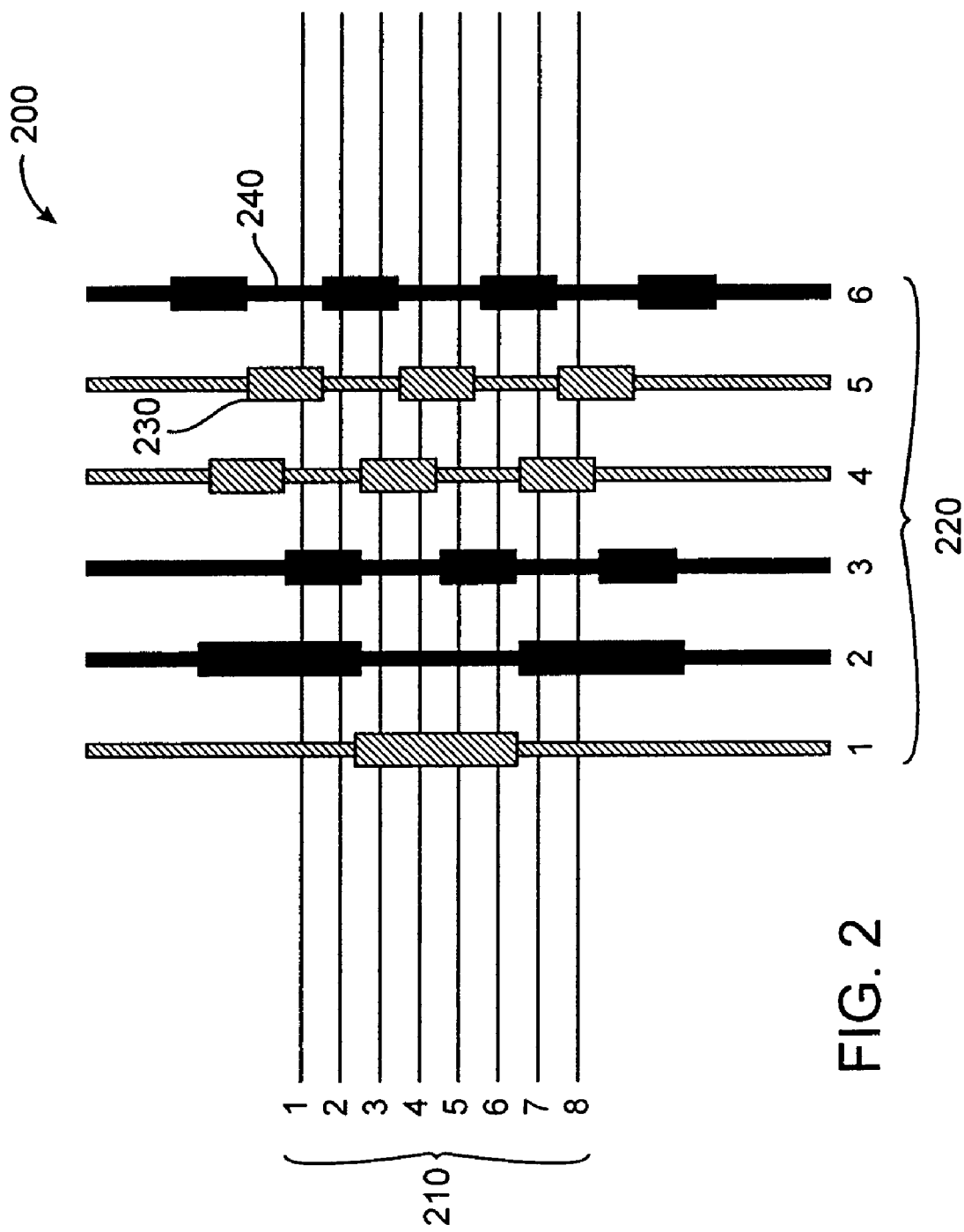
FIG. 2 is a simplified system for addressing nanometer-scale devices according to an embodiment of the present invention.

FIG. 2 is a simplified system for addressing nanometer-scale devices according to an embodiment of the present invention. The diagram is merely an example, which should not unduly limit the scope of the present invention. One of ordinary skill in the art would recognize many variations, alternatives, and modifications. The system 200 includes nanometer-devices 210 and address lines 220. Although the above has been shown using components 210 and 220, there can be many alternatives, modifications, and variations. Some of the systems may be combined. Other systems may be added to the system 200. Depending upon the embodiment, one or more of the systems may be replaced. Further details of these systems are found throughout the present specification and more particularly below.

As shown in FIG. 2, the nanometer-scale devices 210 include a plurality of nanometer-scale wires ("nanowires"). The nanowires may include the nanowire 1 through the nanowire n. n is a positive integer. For example, n equals 8. In one embodiment, the nanowires are substantially parallel to each other. In another embodiment, the nanowires are connected to other nanometer-scale devices. The nanowires may have various diameters and separations. In one embodiment, the separation is defined as the distance from the center of one nanowire to the center of another adjacent nanowire. For example, the separation between two adjacent nanowires ranges from 10 nm to 100 nm. The nanowire diameter ranges from 8 nm to 80 nm. In another example, the nanowire diameter is about 8 nm, and the separation between two adjacent nanowires is about 16 nm. In yet another example, the nanowires have a cross-section other than circular.

Also as shown in FIG. 2, the address lines 220 include the address lines 1 through m. m is a positive integer. For example, m equals 6. In one embodiment, the address lines are substantially parallel to each other. The address lines may have various diameters and separations. For example, the diameter of an address line ranges from 50 nm to 250 nm. The separation between two adjacent address lines ranges from 100 nm to 500 nm.

Each of the address lines 220 includes at least a gate region and an inactive region. For example, the address line 1 includes a gate region covering the nanowires 3 through 6, and an inactive region covering the nanowires 1 through 2 and 7 through 8. The address line 2 includes a gate region covering the nanowires 1 through 2 and 7 through 8, and an inactive region covering the nanowires 3 through 6.

The address line 3 includes a gate region covering the nanowires 1 through 2 and 5 through 6, and an inactive region covering the nanowires 3 through 4 and 7 through 8. The address line 4 includes a gate region covering the nanowires 3 through 4 and 7 through 8, and an inactive region covering the nanowires 1 through 2 and 5 through 6.

The address line 5 includes a gate region covering the nanowires 1, 4 through 5, and 8, and an inactive region covering the nanowires 2 through 3 and 6 through 7. The address line 6 includes a gate region covering the nanowires 2 though 3 and 6 through 7, and an inactive region covering the nanowires 1, 4 through 5, and 8.

As discussed above and further emphasized here, FIG. 2 is merely an example, which should not unduly limit the scope of the present invention. One of ordinary skill in the art would recognize many variations, alternatives, and modifications. For example, the nanowires 1 through 8 may be shifted with respect to the address lines. For each address line, the nanowires covered by the gate region and the inactive region may vary based on the relative position between the address lines and the nanowires. In another example, the number of nanowires is different from 8, and the number of address lines is different from 6. In yet another example, the nanometer-scale devices 210 includes certain devices other than nanowires. In yet another example, all the gate regions of all the address lines, such as a gate region 230, each have a length covering at least three nanowires. In yet another example, all the inactive regions of all the address lines, such as the inactive region 240, each have a length covering at least three nanowires.

Figure 3:
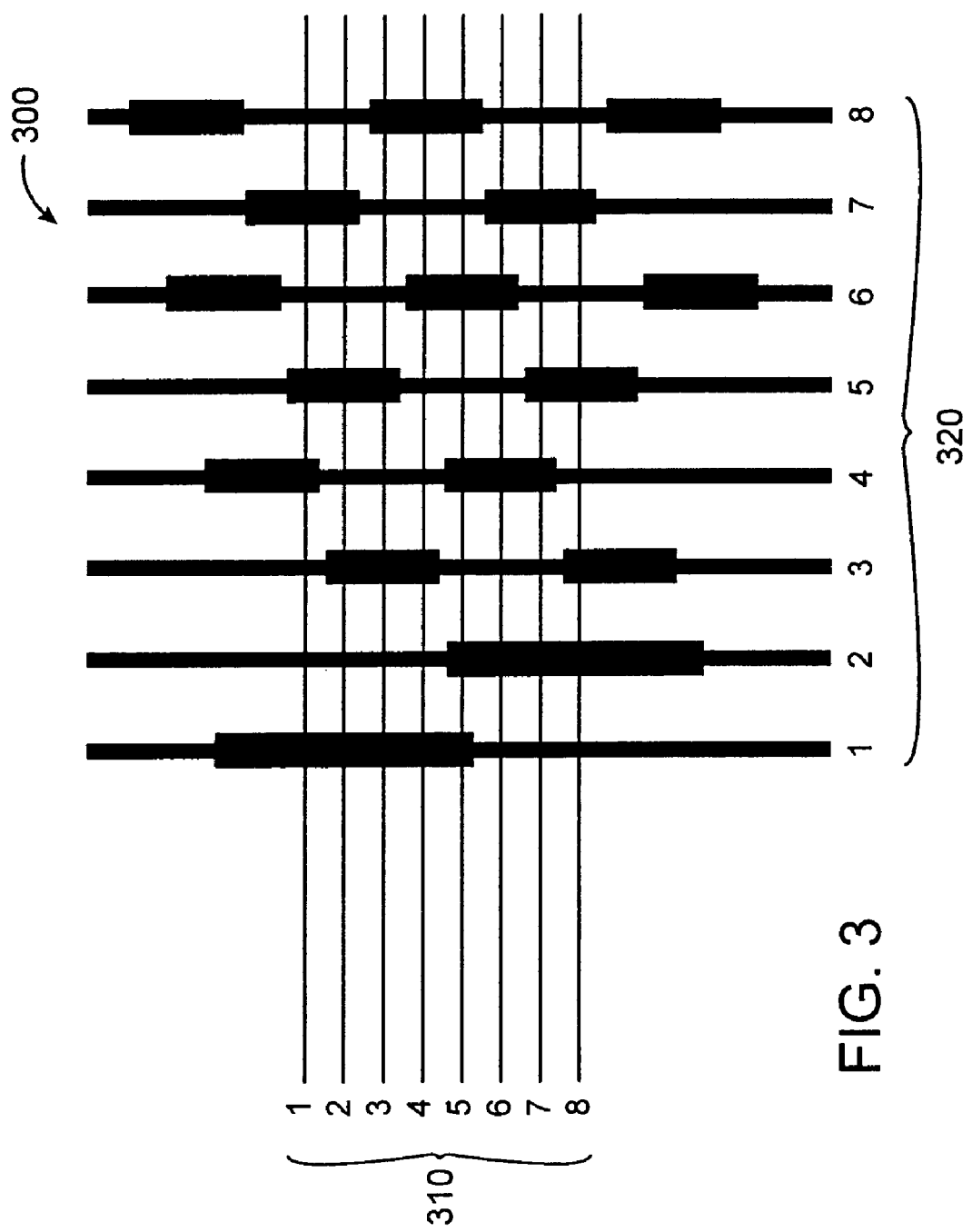
FIG. 3 is a simplified system for addressing nanometer-scale devices according to another embodiment of the present invention.

FIG. 3 is a simplified system for addressing nanometer-scale devices according to another embodiment of the present invention. The diagram is merely an example, which should not unduly limit the scope of the present invention. One of ordinary skill in the art would recognize many variations, alternatives, and modifications. The system 300 includes nanometer-devices 310 and address lines 320. Although the above has been shown using components 310 and 320, there can be many alternatives, modifications, and variations. Some of the systems may be combined. Other systems may be added to the system 300. Depending upon the embodiment, one or more of the systems may be replaced. Further details of these systems are found throughout the present specification and more particularly below.

As shown in FIG. 3, the nanometer-scale devices 310 include a plurality of nanowires. The nanowires may include the nanowire 1 through the nanowire n. n is a positive integer. For example, n equals 8. In one embodiment, the nanowires are substantially parallel to each other. In another embodiment, the nanowires are connected to other nanometer-scale devices. The nanowires may have various diameters and separations. For example, the nanowire diameter ranges from 8 nm to 80 nm. The separation between two adjacent nanowires ranges from 10 nm to 100 nm. In another example, the nanowire diameter is about 8 nm, and the separation between two adjacent nanowires is about 16 nm.

Also as shown in FIG. 3, the address lines 320 include the address lines 1 through m. m is a positive integer. For example, m equals 8. In one embodiment, the address lines are substantially parallel to each other. The address lines may have various diameters and separations. For example, the diameter of an address line ranges from 50 nm to 250 nm. The separation between two adjacent address lines ranges from 100 nm to 500 nm.

Each of the address lines 320 includes at least a gate region and an inactive region. For example, the address line 1 includes a gate region covering the nanowires 1 through 4, and an inactive region covering the nanowires 5 through 8. The address line 2 includes a gate region covering the nanowires 5 through 8, and an inactive region covering the nanowires 1 through 4.

The address line 3 includes a gate region covering the nanowires 2 through 4 and 8, and an inactive region covering the nanowires 1 and 5 through 7. The address line 4 includes a gate region covering the nanowires 1 and 5 through 7, and an inactive region covering the nanowires 2 through 4 and 8.

The address line 5 includes a gate region covering the nanowires 1 through 3 and 7 through 8, and an inactive region covering the nanowires 4 through 6. The address line 6 includes a gate region covering the nanowires 4 through 6, and an inactive region covering the nanowires 1 through 3 and 7 through 8.

The address line 7 includes a gate region covering the nanowires 1 through 2 and 6 through 8, and an inactive region covering the nanowires 3 through 5. The address line 8 includes a gate region covering the nanowires 3 through 5, and an inactive region covering the nanowires 1 through 2 and 6 through 8.

Figure 4:
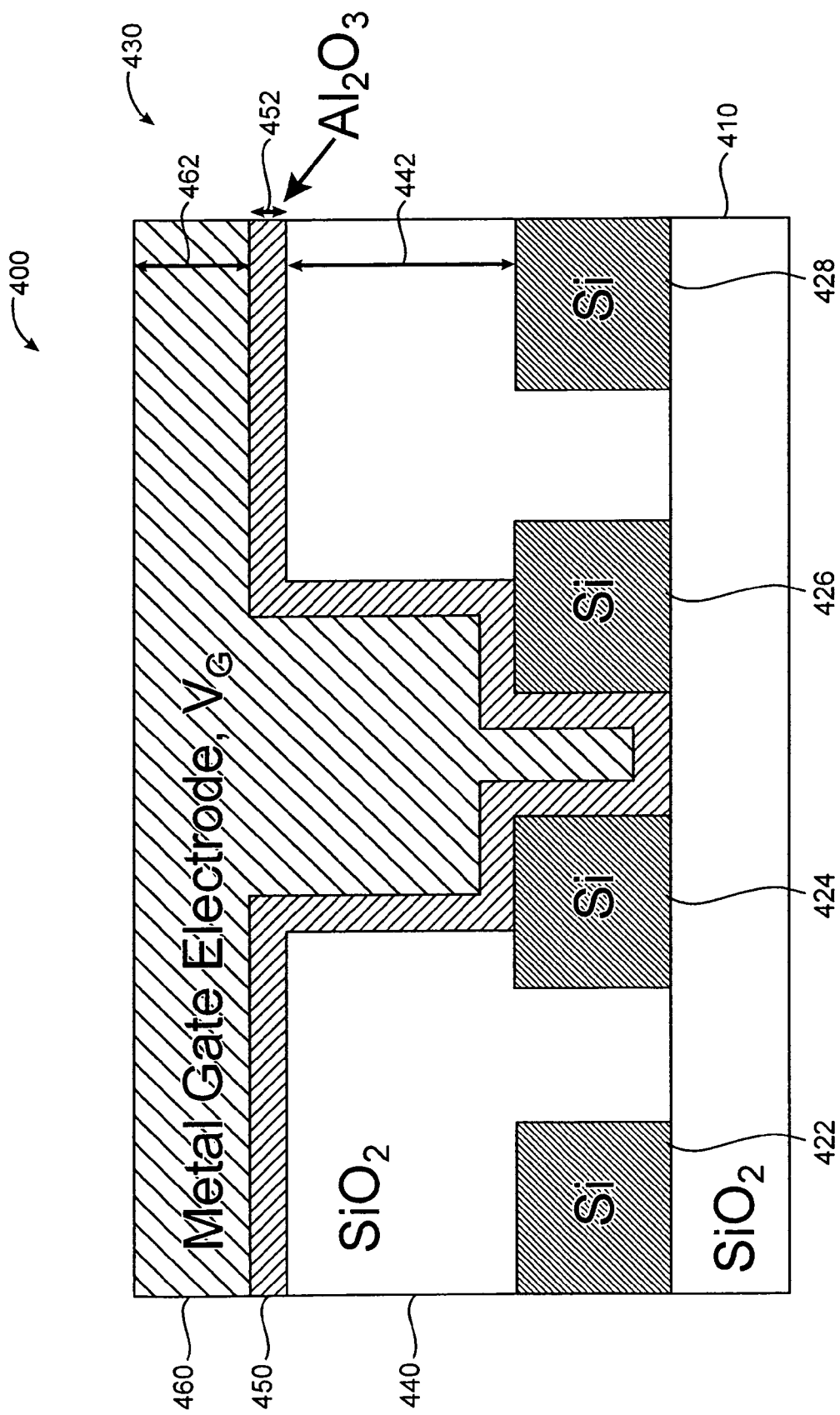
FIG. 4 shows simplified intersections between address lines and nanometer-scale devices according to an embodiment of the present invention.

FIG. 4 shows simplified intersections between address lines and nanometer-scale devices according to an embodiment of the present invention. The diagram is merely an example, which should not unduly limit the scope of the present invention. One of ordinary skill in the art would recognize many variations, alternatives, and modifications. The intersections 400 includes an insulating layer 410, nanowires 422, 424, 426 and 428, and an address line 430. Although the above has been shown using components 410, 422, 424, 426, 428 and 430, there can be many alternatives, modifications, and variations. Some of the systems may be combined. Other systems may be added to the intersections 400. Depending upon the embodiment, one or more of the systems may be replaced. Further details of these systems are found throughout the present specification and more particularly below.

FIG. 4 shows cross-sections of the nanowires 422, 424, 426, and 428 on the insulating layer 410. For example, the insulating layer 410 is made of dielectric material such as $SiO_2$. In another example, the insulating layer 410 is made of plastic. The nanowires 422, 424, 426, and 428 are made of semiconductor material. For example, the semiconductor material may be silicon, germanium, gallium arsenide, or any combination thereof. Silicon may be polysilicon or crystalline silicon and may be doped or undoped. In one embodiment, the nanowires 422, 424, 426, and 428 are four adjacent nanowires 210 as shown in FIG. 2. For example, the nanowire diameter ranges from 8 nm to 80 nm. The separation between two adjacent nanowires ranges from 10 nm to 100 nm. In another example, the nanowire diameter is about 8 nm, and the separation between two adjacent nanowires is about 16 nm.

The address line 430 includes a dielectric layer 440, a dielectric layer 450, and a metal layer 460. In one embodiment, the dielectric layer 440 has a dielectric constant smaller than that of the dielectric layer 450. For example, the dielectric layer 440 is made of $SiO_2$ with a dielectric constant substantially equal to 3.9. The dielectric layer 450 is made of $Al_2O_3$ with a dielectric constant substantially equal to 9.8. In another example, the dielectric layer 440 is made of $SiO_2$ with a dielectric constant substantially equal to 3.9. The dielectric layer 450 is made of $HfO_2$ or $ZrO_2$. In yet another example, the dielectric layer 440 is made of PMMA, and the dielectric layer 450 is made of $SiO_2$ with a dielectric constant substantially equal to 3.9. The thickness 442 of the dielectric layer 440 may range from 50 nm to 1 μm. The thickness 452 of the dielectric layer 450 may range from 5 nm to 25 nm. The metal layer 460 is made of metal or conductive alloy. For example, the metal layer is made of titanium, aluminum, platinum, copper, gold, or any combination thereof. In another example, the metal layer 460 includes three sub-layers made of titanium, aluminum, and platinum. The thickness 462 of the metal layer 460 may range from 100 nm to 1 μm. As shown in FIG. 4, the address line 430 has a gate region covering the nanowires 424 and 426, and an inactive region covering the nanowires 422 and 428.

If the nanowires 424 and 426 are made of p-type semiconductor material such as p-type silicon, a positive voltage applied to the metal layer 460 would increase the resistivity of the nanowire 424 and 426. If the nanowires 424 and 426 are made of n-type semiconductor material, a negative voltage applied to the metal layer 460 would increase the resistivity of the nanowire 424 and 426. In contrast, the nanowires 422 and 428 are not substantially affected by the voltage applied to the metal layer 460. In one embodiment, the voltage applied to the metal layer 460 is measured with respect to the voltage level of the nanowire segments under the metal layer 460. The capacitance between the metal layer 460 and the nanowire 422 or 428 is significantly larger than the capacitance between the metal layer 460 and the nanowire 424 or 426. For example, the ratio between the resistivity change for the nanowires 424 or 426 and the resistivity change for the nanowires 422 or 428 ranges from 2 to 100.

As discussed above and further emphasized here, FIG. 4 is merely an example, which should not unduly limit the scope of the present invention. One of ordinary skill in the art would recognize many variations, alternatives, and modifications. In one embodiment, the address line 430 has a gate region covers two or over two nanowires. For example, the nanowires 422, 424, 426, and 428 are four adjacent nanowires 310 as shown in FIG. 3. In another embodiment, the dielectric layers 440 and 450 are made of the same dielectric material. In yet another embodiment, the dielectric layer 440 has a dielectric constant equal to or larger than the dielectric layer 450.

In yet another embodiment, the addressing system as shown in FIG. 2 or 3 may be used for devices larger than nanometer-scale devices, such as micrometer-scale devices. For example, the micrometer scale devices include micrometer-scale wires. The -wires may have a diameter ranging from 500 nm to 10 μm, and a pitch ranging from 1 μm to 20 μm. In one example, the pitch is defined as the distance between the center of one wire and the center of another adjacent wire.

FIG. 4A is a simplified system for addressing devices according to yet another embodiment of the present invention. The diagram is merely an example, which should not unduly limit the scope of the present invention. One of ordinary skill in the art would recognize many variations, alternatives, and modifications. The system 2000 includes devices 2100 and address lines 2200. Although the above has been shown using components 2100 and 2200, there can be many alternatives, modifications, and variations. Some of the systems may be combined. Other systems may be added to the system 2000. Depending upon the embodiment, one or more of the systems may be replaced. Further details of these systems are found throughout the present specification and more particularly below.

As shown in FIG. 4A, the devices 2100 include a plurality of signal wires. In one embodiment, the signal wires are substantially parallel to each other. In another embodiment, the signal wires are connected to other devices. The signal wires may have various diameters and separations. Also as shown in FIG. 4A, the address lines 2200 may be substantially parallel to each other. The address lines may have various diameters and separations. Each of the address lines 220 includes at least a gate region and an inactive region. The gate region can be small enough to cover only one signal wire.

FIG. 4B shows simplified intersections between address lines and devices according to another embodiment of the present invention. The diagram is merely an example, which should not unduly limit the scope of the present invention. One of ordinary skill in the art would recognize many variations, alternatives, and modifications. The intersections 4000 includes an insulating layer 4100, signal wires 4220, 4240, and 4280, and an address line 4300. Although the above has been shown using components 4100, 4220, 4240, 4280 and 4300, there can be many alternatives, modifications, and variations. Some of the systems may be combined. Other systems may be added to the intersections 4000. Depending upon the embodiment, one or more of the systems may be replaced. Further details of these systems are found throughout the present specification and more particularly below.

FIG. 4B shows cross-sections of the signal wires 4220, 4240, and 4280 on the insulating layer 4100. For example, the insulating layer 4100 is made of dielectric material such as $SiO_2$. In another example, the insulating layer 4100 is made of plastic. The signal wires 4220, 4240, and 4280 are made of semiconductor material. For example, the semiconductor material may be silicon, germanium, gallium arsenide, or any combination thereof. Silicon may be polysilicon or crystalline silicon and may be doped or undoped. In one embodiment, the signal wires 4220, 4240, and 4280 are three adjacent signal wires 2100 as shown in FIG. 4A.

The address line 4300 includes a dielectric layer 4400, a dielectric layer 4500, and a metal layer 4600. In one embodiment, the dielectric layer 4400 has a dielectric constant smaller than that of the dielectric layer 4500. For example, the dielectric layer 4400 is made of PMMA, and the dielectric layer 4500 is made of $SiO_2$ with a dielectric constant substantially equal to 3.9. In another example, the dielectric layer 4400 is made of $SiO_2$ with a dielectric constant substantially equal to 3.9. The dielectric layer 4500 is made of $Al_2O_3$ with a dielectric constant substantially equal to 9.8. In yet another example, the dielectric layer 4400 is made of $SiO_2$ with a dielectric constant substantially equal to 3.9. The dielectric layer 4500 is made of $HfO_2$ or $ZrO_2$. The thickness 4420 of the dielectric layer 4400 may range from 50 nm to 500 nm. The thickness 4520 of the dielectric layer 4500 may range from 3 nm to 25 nm. The metal layer 4600 is made of metal or conductive alloy. For example, the metal layer is made of titanium, aluminum, platinum, copper, gold, or any combination thereof. In another example, the metal layer 4600 includes three sub-layers made of titanium, aluminum, and platinum. The thickness 4620 of the metal layer 4600 may range from 75 nm to 1 82 m. As shown in FIG. 4B, the address line 4300 has an inactive region covering the signal wires 4220 and 4280, and a gate region covering the signal wire 4240. The resistivity of the signal wire 4240 depends on the voltage applied to the metal layer 4600.

Fabrication of System for Addressing Devices

Figure 5:
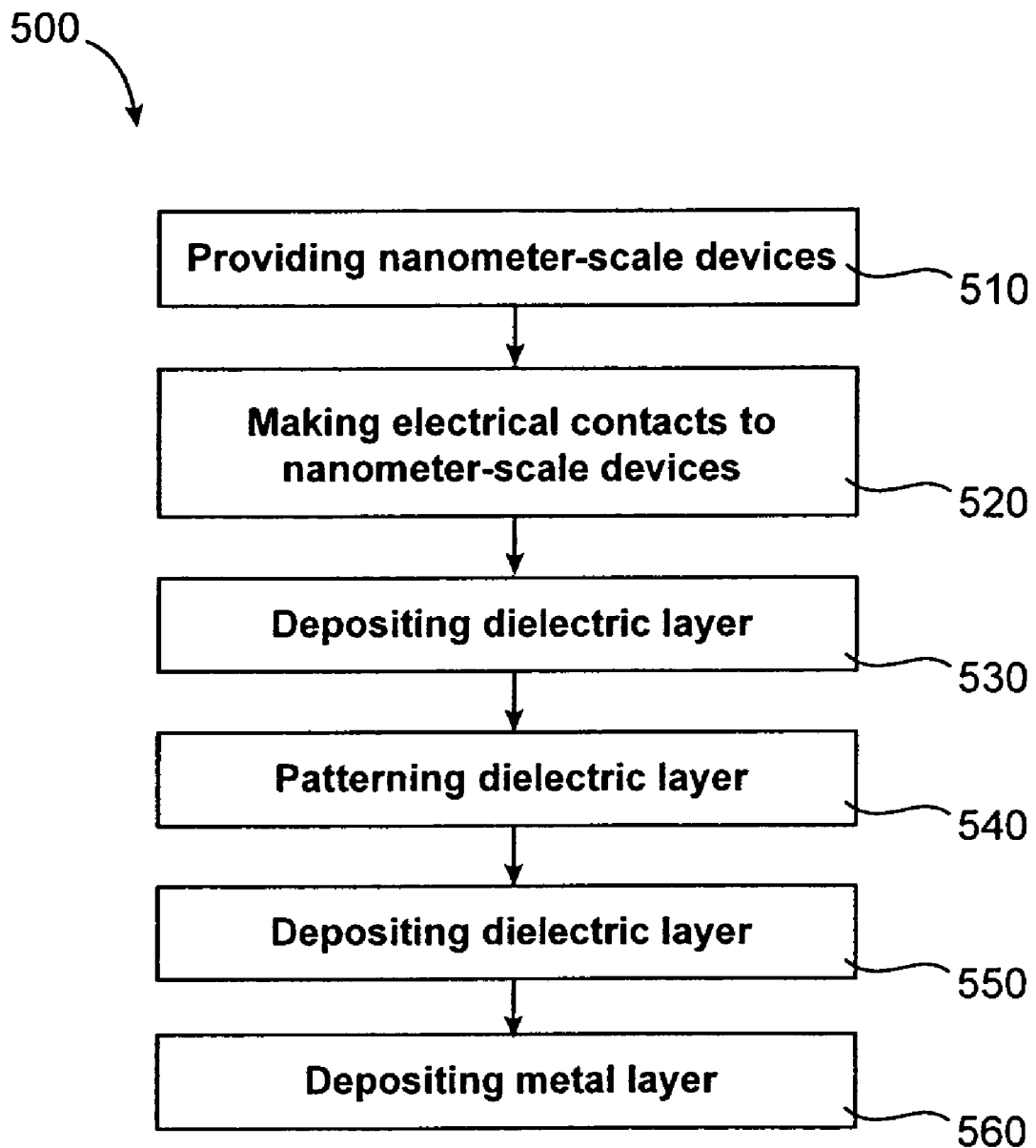
FIG. 5 is a simplified method for fabricating system for addressing nanometer-scale devices according to an embodiment of the present invention.

FIG. 5 is a simplified method for fabricating system for addressing nanometer-scale devices according to an embodiment of the present invention. This diagram is merely an example, which should not unduly limit the scope of the claims. One of ordinary skill in the art would recognize many variations, alternatives, and modifications. The method 500 includes a process 510 for providing nanometer-scale devices, a process 520 for making electrical contacts to nanometer-scale devices, a process 530 for depositing dielectric layer, a process 540 for patterning dielectric layer, a process 550 for depositing dielectric layer, and a process 560 for depositing metal layer. Although the above has been shown using a selected sequence of processes, there can be many alternatives, modifications, and variations. For example, some of the processes may be expanded and/or combined. Other processes may be inserted to those noted above. Depending upon the embodiment, the specific sequence of processes may be interchanged with others replaced. For example, the process 520 for making electrical contacts is performed after the process 530, 540, 550, or 560. Further details of these processes are found throughout the present specification and more particularly below.

Figure 6:
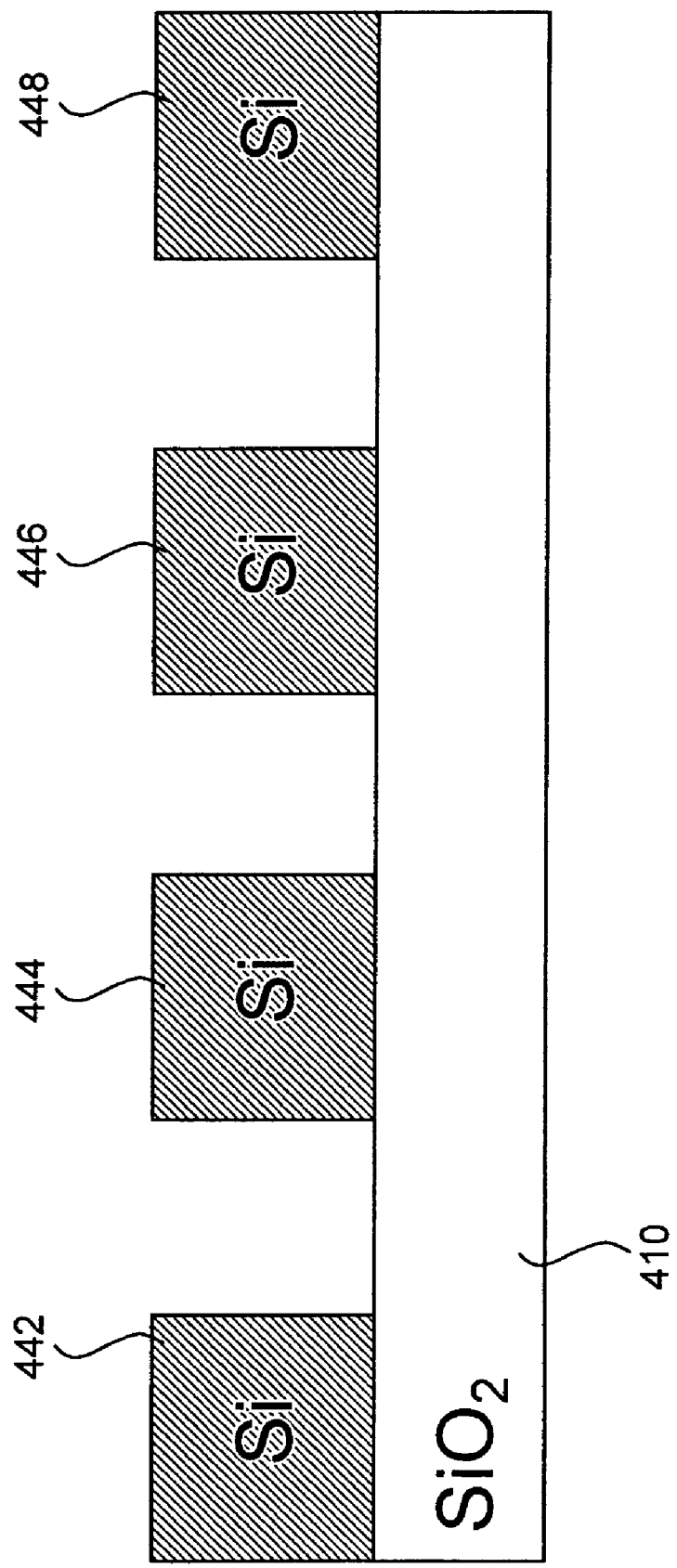
FIG. 6 is a simplified diagram for providing nanometer-scale devices according to an embodiment of the present invention.

At the process 510, nanometer-scale devices are provided. FIG. 6 is a simplified diagram for providing nanometer-scale devices according to an embodiment of the present invention. The diagram is merely an example, which should not unduly limit the scope of the present invention. One of ordinary skill in the art would recognize many variations, alternatives, and modifications. The nanowires 422, 424, 426, and 428 are fabricated on the insulating layer 410. For example, the insulating layer 410 is made of dielectric material such as $SiO_2$. In another example, the insulating layer 410 is made of plastic. The nanowires 422, 424, 426, and 428 are made of semiconductor material. For example, the semiconductor material may be silicon, germanium, gallium arsenide, or any combination thereof Silicon may be polysilicon or crystalline silicon and may be doped or undoped. For example, the nanowire diameter ranges from 8 nm to 80 nm. The separation between two adjacent nanowires ranges from 10 nm to 100 nm. In another example, the nanowire diameter is about 8 nm, and the separation between two adjacent nanowires is about 16 nm. See PCT Patent Application No. PCT/US2003/023546 and International Publication No. WO/2004/012234, both of which are incorporated by reference herein.

Figure 7:
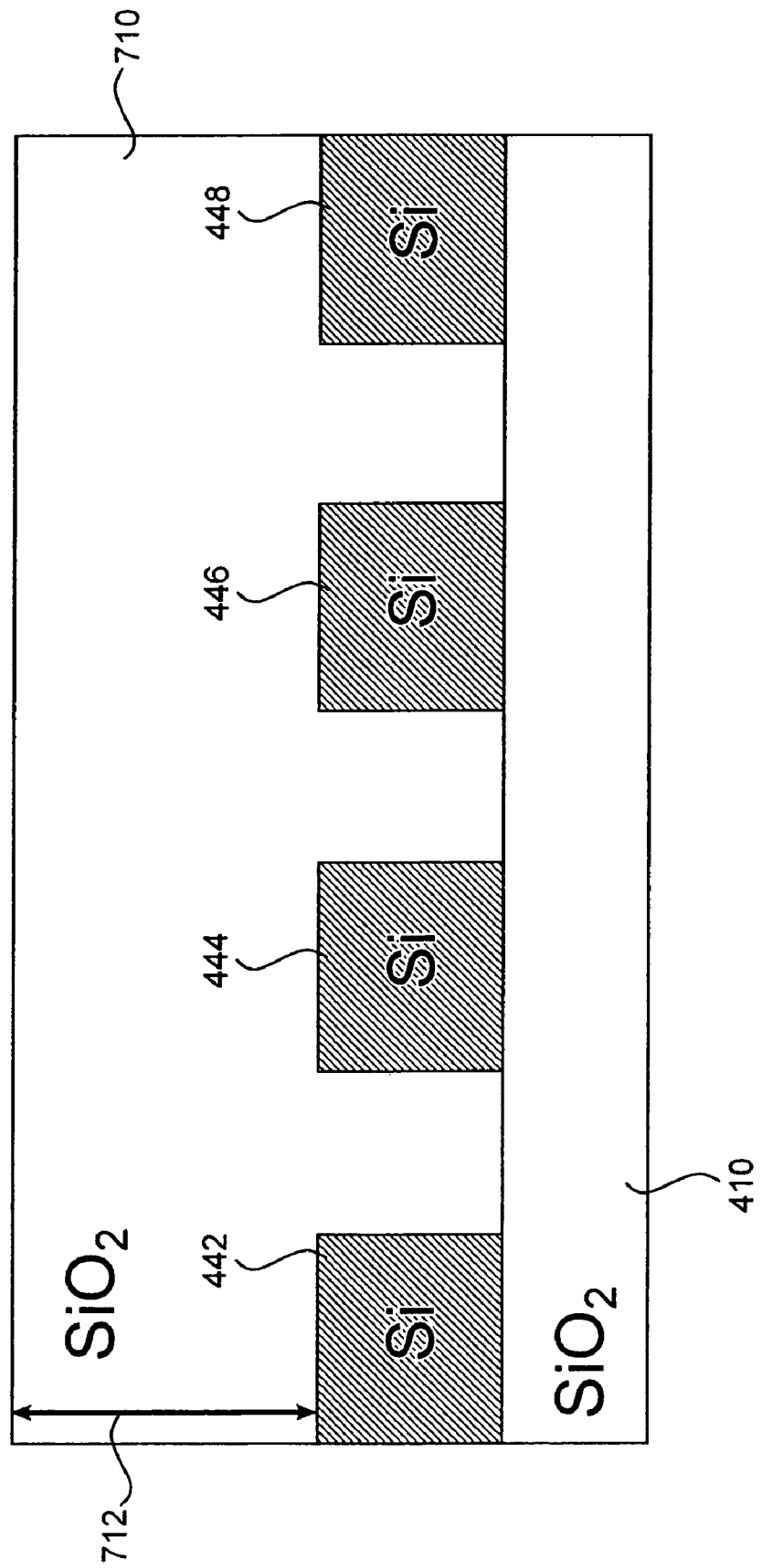
FIG. 7 is a simplified diagram for forming dielectric layer according to an embodiment of the present invention.

At the process 520, electrical contacts are made to the nanometer-scale devices, such as the nanowires 442, 444, 446, and 448. At the process 530, a dielectric layer is deposited. FIG. 7 is a simplified diagram for forming dielectric layer according to an embodiment of the present invention. The diagram is merely an example, which should not unduly limit the scope of the present invention. One of ordinary skill in the art would recognize many variations, alternatives, and modifications. A dielectric layer 710 is deposited on the insulating layer 410 and the nanowires 442, 444, 446, and 448. For example, the dielectric layer 710 is made of $SiO_2$ with a dielectric constant substantially equal to 3.9. In another example, the dielectric layer 710 is made of PMMA. The thickness 712 of the dielectric layer 710 may range from 50 nm to 1 µm. The formation of the dielectric layer 710 may use plasma enhanced chemical vapor deposition (PECVD), low pressure chemical vapor deposition (LPCVD), sputtering deposition, or other deposition technique.

Figure 8:
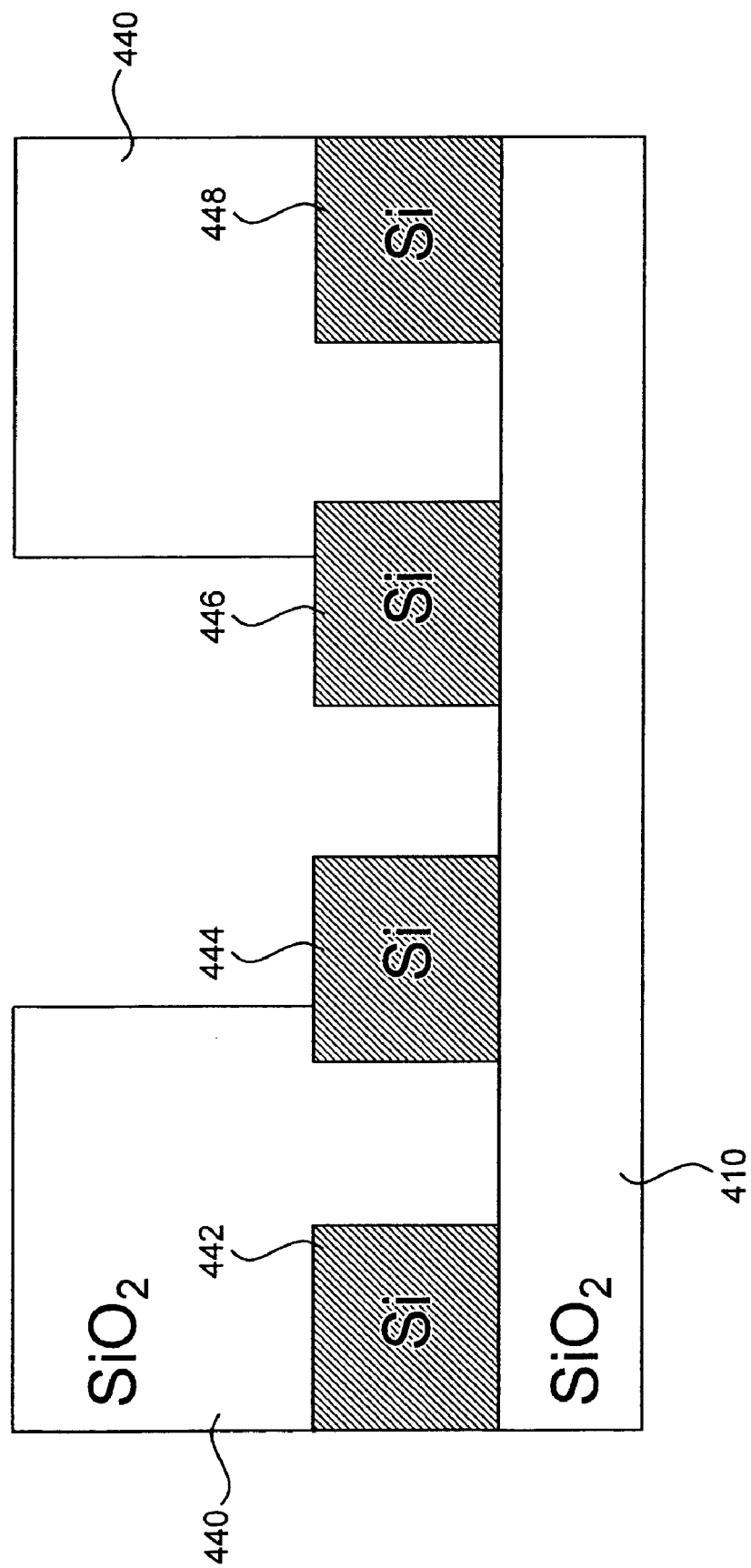
FIG. 8 is a simplified diagram for patterning dielectric layer according to an embodiment of the present invention.

At the process 540, the dielectric layer 710 is patterned. FIG. 8 is a simplified diagram for patterning dielectric layer according to an embodiment of the present invention. The diagram is merely an example, which should not unduly limit the scope of the present invention. One of ordinary skill in the art would recognize many variations, alternatives, and modifications. The dielectric layer 710 is selectively etched to expose at least part of the nanowires 444 and 446 and to form the dielectric layer 440. In one embodiment, prior to the etching process, a photoresist layer is formed on the dielectric layer 710 and patterned by a lithographic process. The lithographic process may use a light beam or an electron beam. In another embodiment, the etching of the dielectric layer 610 includes a reactive ion etching (RIE) process. For example, the reactive etching process may be performed at a pressure ranging from 5 mTorr to 100 mTorr, a $CF_4$ flow ranging from 5 sccm to 500 sccm, an $H_2$ flow ranging from 2 sccm to 20 sccm, and a power level ranging from 20 watts to 100 watts. Additionally, a power frequency may range from 100 kHz to 200 MHz. In another example, the reactive etching process is performed at a pressure equal to 7 mTorr, a $CF_4$ flow equal to 20 sccm, an $H_2$ flow equal to 6 sccm, a power lever equal to 35 watts, and a power frequency equal to 40 MHz. Additionally, the etching process may use the etching tool manufactured by Unaxis. The etching rate for $SiO_2$ may be about 25 times greater than the etching rate for Si.

Figure 9:
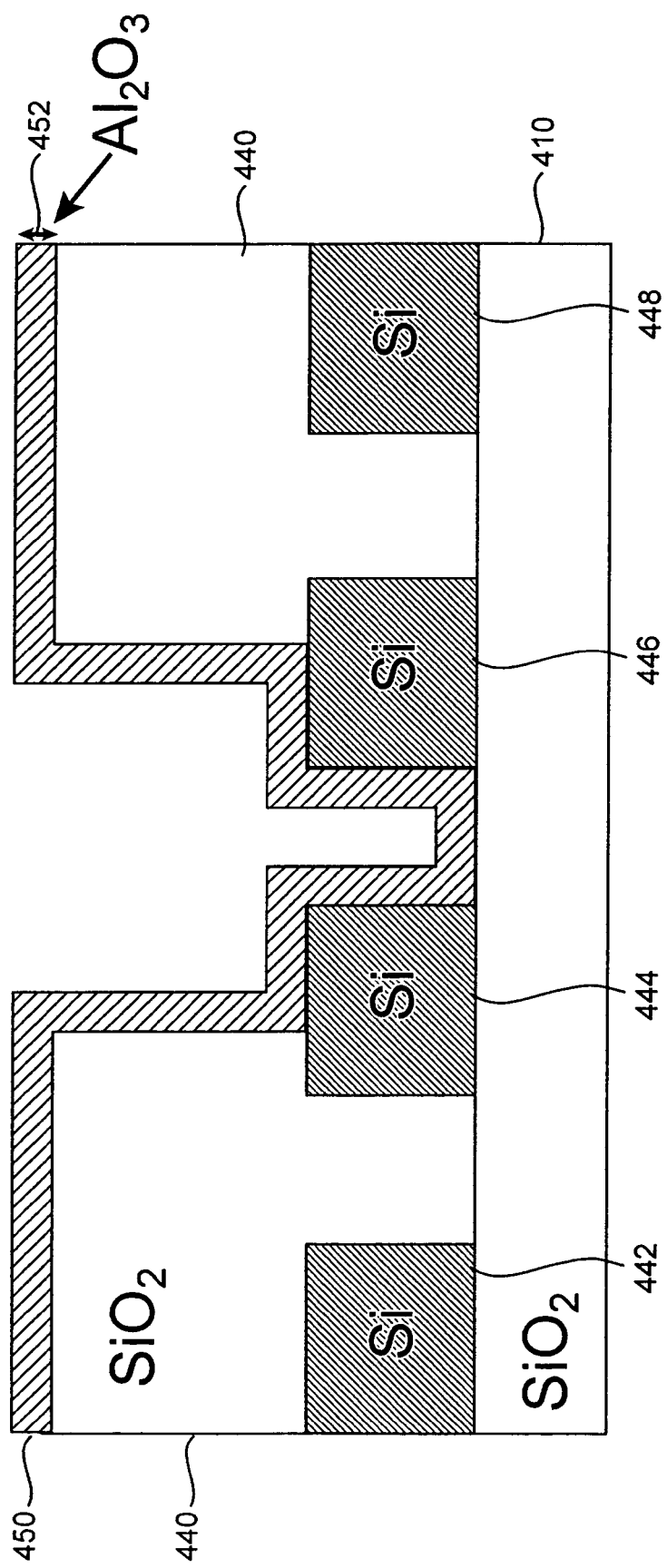
FIG. 9 is a simplified diagram for forming dielectric layer according to an embodiment of the present invention.

At the process 550, a dielectric layer is deposited. FIG. 9 is a simplified diagram for forming dielectric layer according to an embodiment of the present invention. The diagram is merely an example, which should not unduly limit the scope of the present invention. One of ordinary skill in the art would recognize many variations, alternatives, and modifications. The dielectric layer 450 is formed on at least the dielectric layer 440 and the nanowires 444 and 446. The formation process may use sputtering deposition, reactive electron beam evaporation, atomic layer deposition, or other deposition technique. The dielectric layer 450 may be made of $Al_2O_3$, $HfO_2$, $ZrO_2$, or $SiO_2$. The thickness 452 of the dielectric layer 450 may range from 5 nm to 25 nm in one example and 3 nm to 50 nm in another example.

Figure 10:
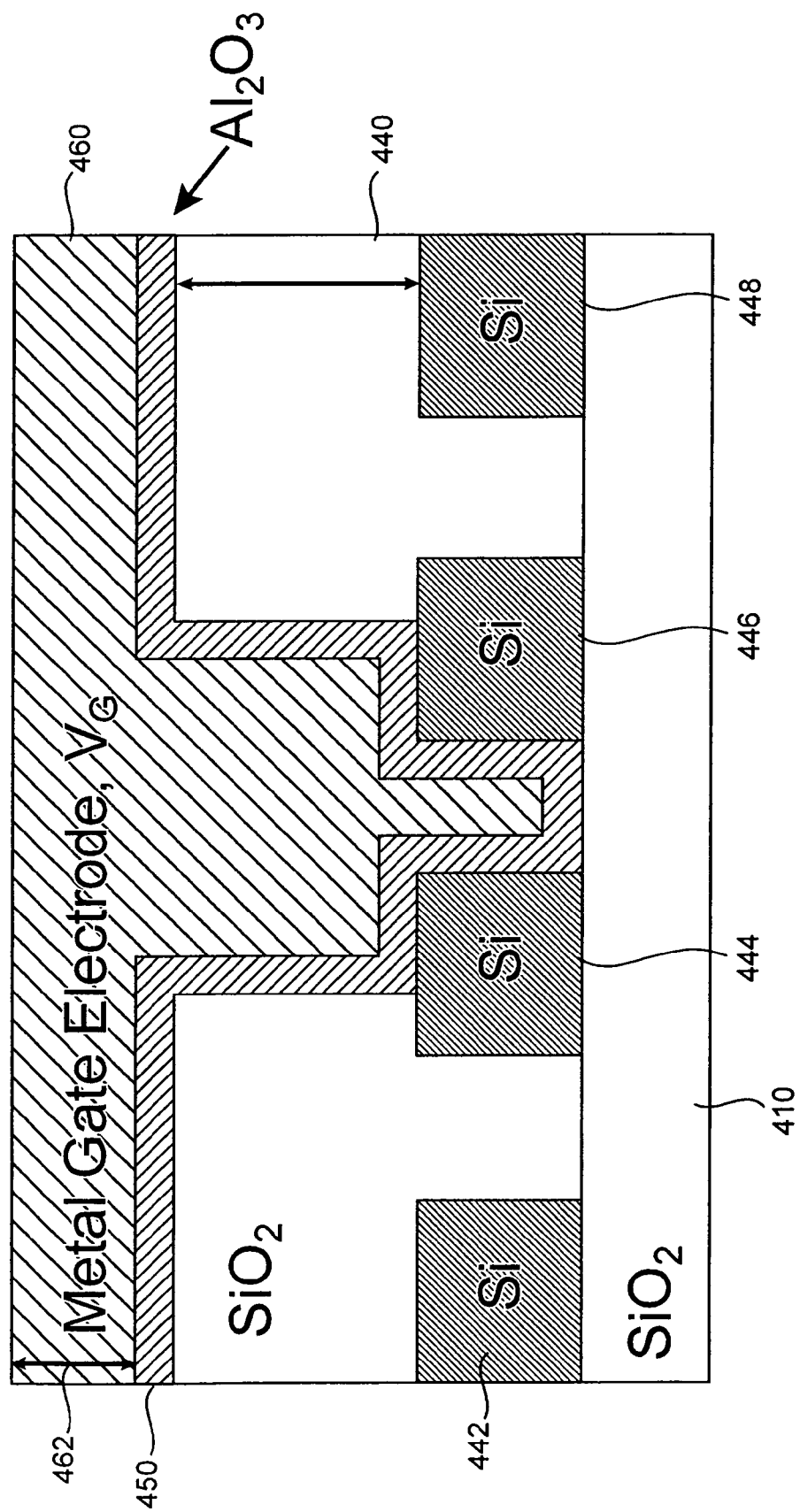
FIG. 10 is a simplified diagram for forming metal layer according to an embodiment of the present invention.

At the process 560, a metal layer is deposited. FIG. 10 is a simplified diagram for forming metal layer according to an embodiment of the present invention. The diagram is merely an example, which should not unduly limit the scope of the present invention. One of ordinary skill in the art would recognize many variations, alternatives, and modifications. The metal layer 450 is deposited on the dielectric layer 450. The deposition process may use plasma enhanced chemical vapor deposition (PECVD), low pressure chemical vapor deposition (LPCVD), sputtering deposition, electron beam deposition, or other deposition technique. The metal layer 450 may be made of titanium, aluminum, platinum, copper, gold, or any combination thereof. For example, the metal layer 460 includes three sub-layers made of titanium, aluminum, and platinum. The thickness 462 of the metal layer 460 may range from 100 nm to 1 μm in one example and from 75 nm to 1 μm in another example. The metal layer 460 may be further patterned by a lithographic and etching process. The dielectric layers 440 and 450 and the metal layer 460 form the address line 430. The gate region of the address line 430 covers the nanowires 444 and 446.

As discussed above and further emphasized here, FIGS. 5-10 are merely examples, which should not unduly limit the scope of the present invention. One of ordinary skill in the art would recognize many variations, alternatives, and modifications. In one embodiment, the address line 430 has a gate region covers more than two or over two nanowires. In another embodiment, the processes 410 through 460 are used to fabricate multiple address lines across multiple nanowires.

Figure 11:
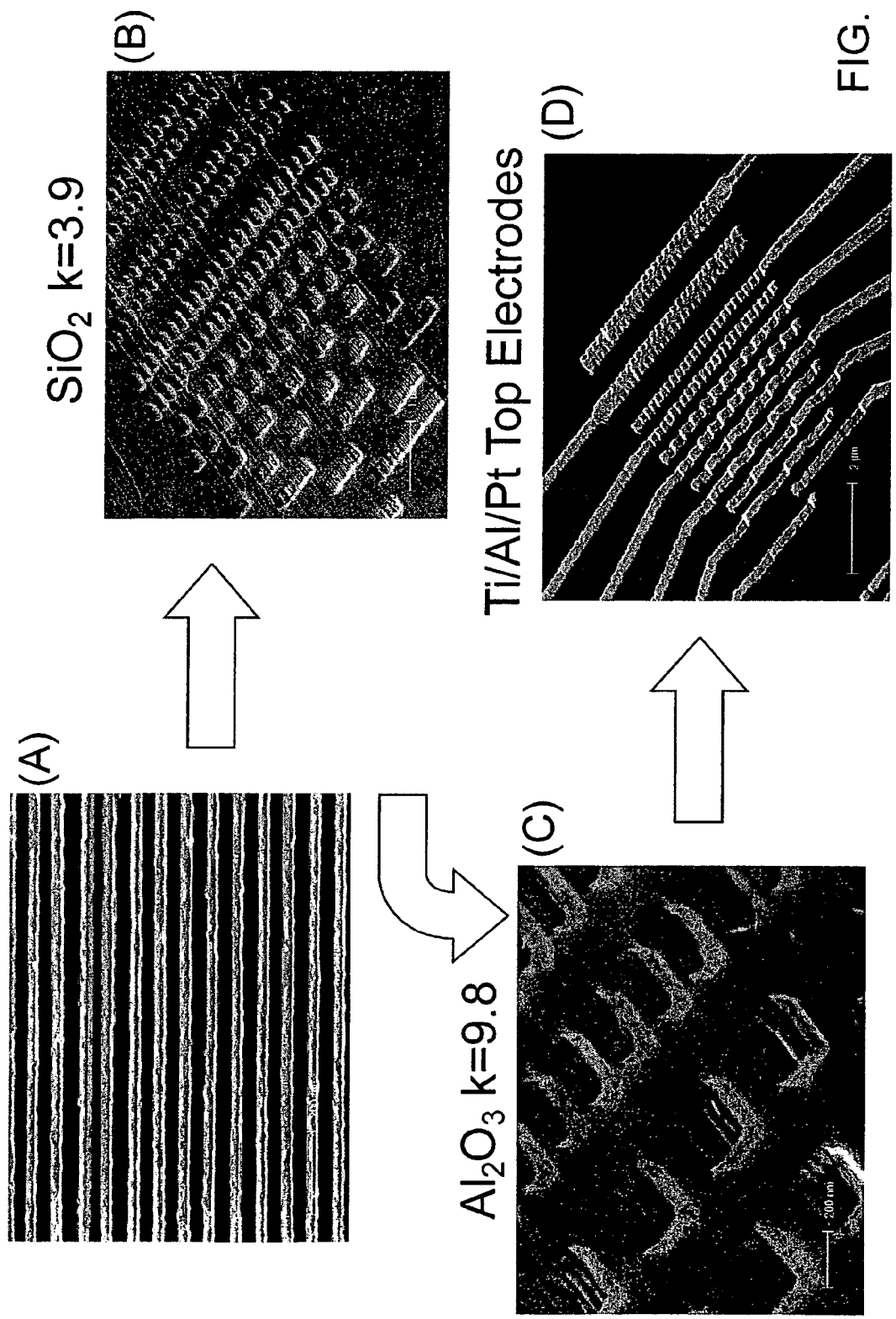
FIGS. 11A through 11D show a simplified method for fabricating multiple address lines according to an embodiment of the present invention.

FIGS. 11A through 11D show a simplified method for fabricating multiple address lines according to an embodiment of the present invention. This diagram is merely an example, which should not unduly limit the scope of the claims. One of ordinary skill in the art would recognize many variations, alternatives, and modifications. At the processes 510 and 520, the nanowires 210 are provided as shown in FIG. 11A. Additionally, the nanowires 210 are connected to electrical contacts respectively. At the processes 530 and 540, the dielectric layer 440 is deposited and patterned as shown in FIG. 11B. At the process 550, the dielectric layer 450 such as a $Al_2O_3$ layer is deposited as shown in FIG. 11C. At the process 560, the metal layer 460 is formed. The metal layer includes three sub-layers made of titanium, aluminum, and platinum respectively.

Operation of System for Addressing Devices

Figure 12:
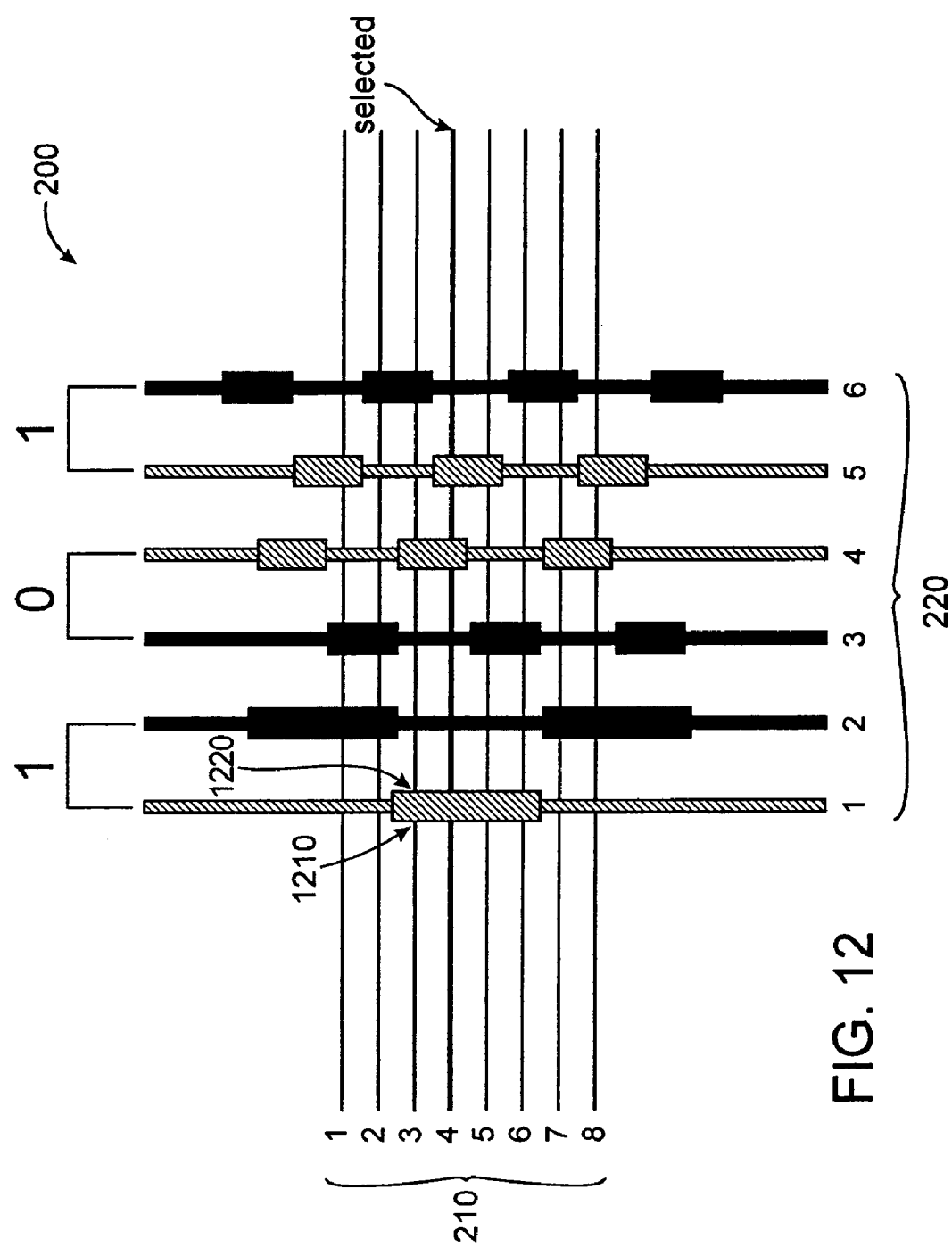
FIG. 12 is a simplified method for addressing nanometer-scale devices according to an embodiment of the present invention.

FIG. 12 is a simplified method for addressing nanometer-scale devices according to an embodiment of the present invention. The diagram is merely an example, which should not unduly limit the scope of the present invention. One of ordinary skill in the art would recognize many variations, alternatives, and modifications. As shown in FIG. 12, the smallest gate region of the address lines 220 covers only two nanowires 210. The address lines 1, 4, and 5 of the system 200 are biased to a turn-on voltage, and address lines 2, 3, and 6 of the system 200 are biased to a turn-off voltage. When the turn-on voltage is applied to an address line, the nanowires covered by the gate region of the address line is in the low-resistivity state. In contrast, when the turn-off voltage is applied to an address line, the nanowires covered by the gate region of the address line is in the high-resistivity state. In one embodiment, the turn-on voltage or the turn-off voltage is measured with respect to the voltage level of the nanowire segments under the address line. For example, the turn-on voltage is substantially equal to zero. In another example, the turn-off voltage ranges from 0.5 volts to 10 volts for a p-type doping concentration ranging from $1\times10^{17}$ $cm^{-3}$ to $5\times10^{19}$ $cm^{-3}$, and the turn-off voltage ranges from −0.5 volts to −10 volts for an n-type doping concentration ranging from $1\times10^{17}$ $cm^{-3}$ to $5\times10^{19}$ $cm^{-3}$. In one embodiment, the gate region of an address line and the nanowire forms a field effect transistor. For example, the gate region of the address line 1 and the nanowire 3 forms a field effect transistor with a source region 1210 and a gain region 1220. When the gate region is biased to the turn-on voltage, the field effect transistor is turned on; when the gate region is biased to the turn-off voltage, the field effect transistor is turned off. Various methods can be used to detect the resistivity state of a nanowire or the "on" or "off" state of a field effect transistor. In one embodiment, an voltage is applied to the nanowires and the resultant current is measured for each nanowire. For example, the applied voltage is set at 2.5 volts.

As shown in FIG. 12, if the address lines 1 through 6 are biased as previously discussed, only the nanowire 4 remains in the low resistivity state. In other words, the field effect transistors formed between the nanowire 4 and the gate regions of the address lines 1, 4, and 5 respectively are all in the turned-on state. The nanowire 4 is selected from the nanowires 1 through 8. In one embodiment, the address lines 1-2, 3-4, and 5-6 form three pairs of address lines representing three digits of a nanowire. For example, the address digit is set to one if the nanowire with an odd number is applied with the turn-on voltage, and the address digit is set to zero if the nanowire with an even number is applied with the turn-off voltage. The address for the nanowire 4 is hence 101.

Figure 13:
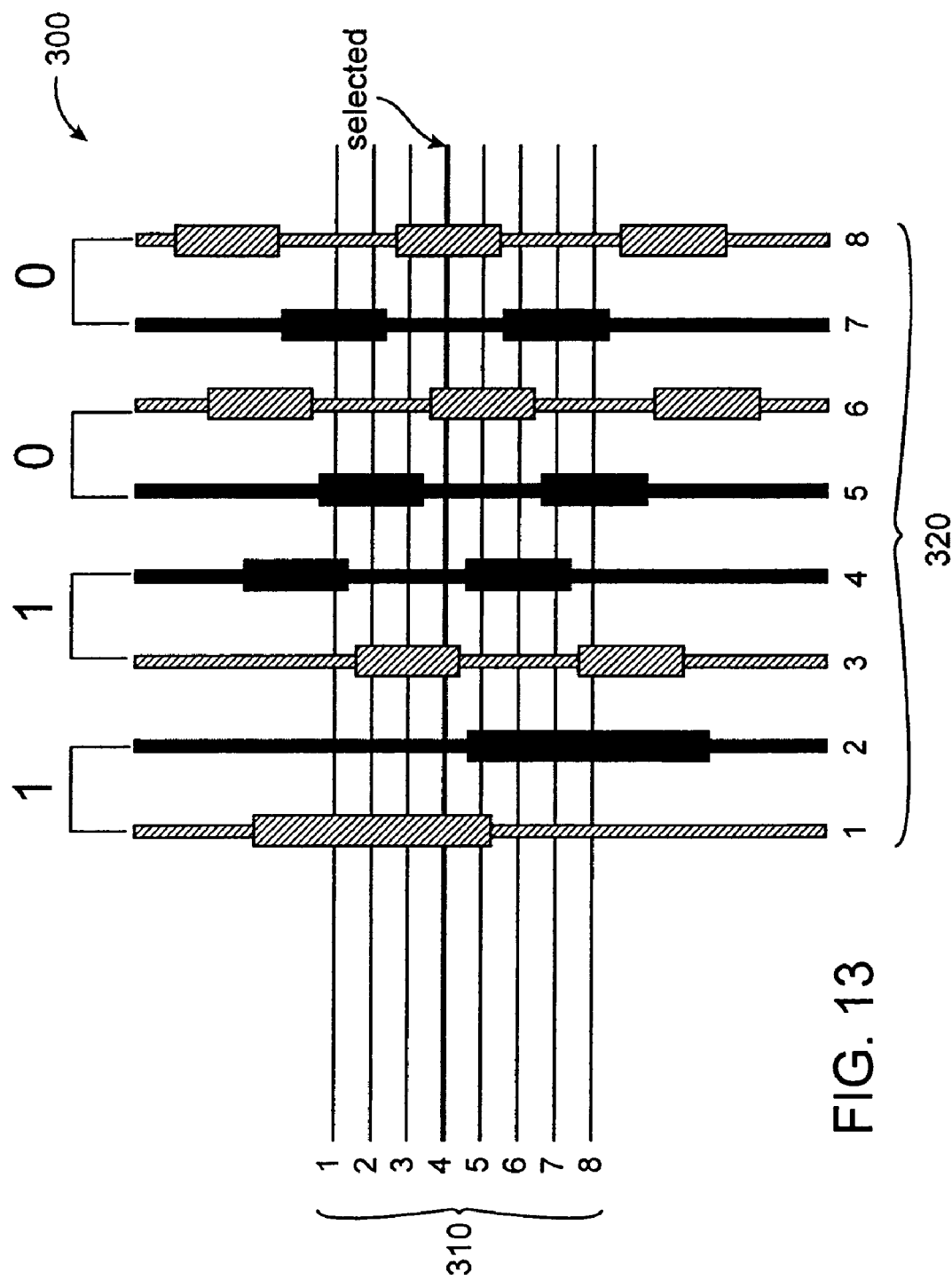
FIG. 13 is a simplified method for addressing nanometer-scale devices according to another embodiment of the present invention.

FIG. 13 is a simplified method for addressing nanometer-scale devices according to another embodiment of the present invention. The diagram is merely an example, which should not unduly limit the scope of the present invention. One of ordinary skill in the art would recognize many variations, alternatives, and modifications. As shown in FIG. 13, the smallest gate region of the address lines 220 covers three nanowires 210. The address lines 1, 3, 6, and 8 of the system 300 are biased to a turn-on voltage, and address lines 2, 4, 5, and 7 of the system 300 are biased to a turn-off voltage. For example, the turn-on voltage is substantially equal to zero. In another example, the turn-off voltage ranges from 0.5 volts to 10 volts for a p-type doping concentration ranging from $1\times10^{17}$ $cm^{-3}$ to $5\times10^{19}$ $cm^{-3}$, and the turn-off voltage ranges from −0.5 volts to −10 volts for an n-type doping concentration ranging from $1\times10^{17}$ $cm^{-3}$ to $5\times10^{19}$ $cm^{-3}$. As shown in FIG. 13, only the nanowire 4 remains in the low resistivity state. In other words, the field effect transistors formed between the nanowire 4 and the gate regions of the address lines 1, 3, 6, and 8 respectively are all in the turned-on state. The nanowire 4 is selected from the nanowires 1 through 8. In one embodiment, the address lines 1-2, 3-4, 5-6, and 7-8 form four pairs of address lines representing four digits of a nanowire. For example, the address for the nanowire 4 is 1100. Although each nanowire has an individual address, some or all nanowires each have more than one individual address. For example, the nanowire 4 has an address 1100 and 1_0_, where "_" means no bias is applied to either wire in the pair.

Figure 14:
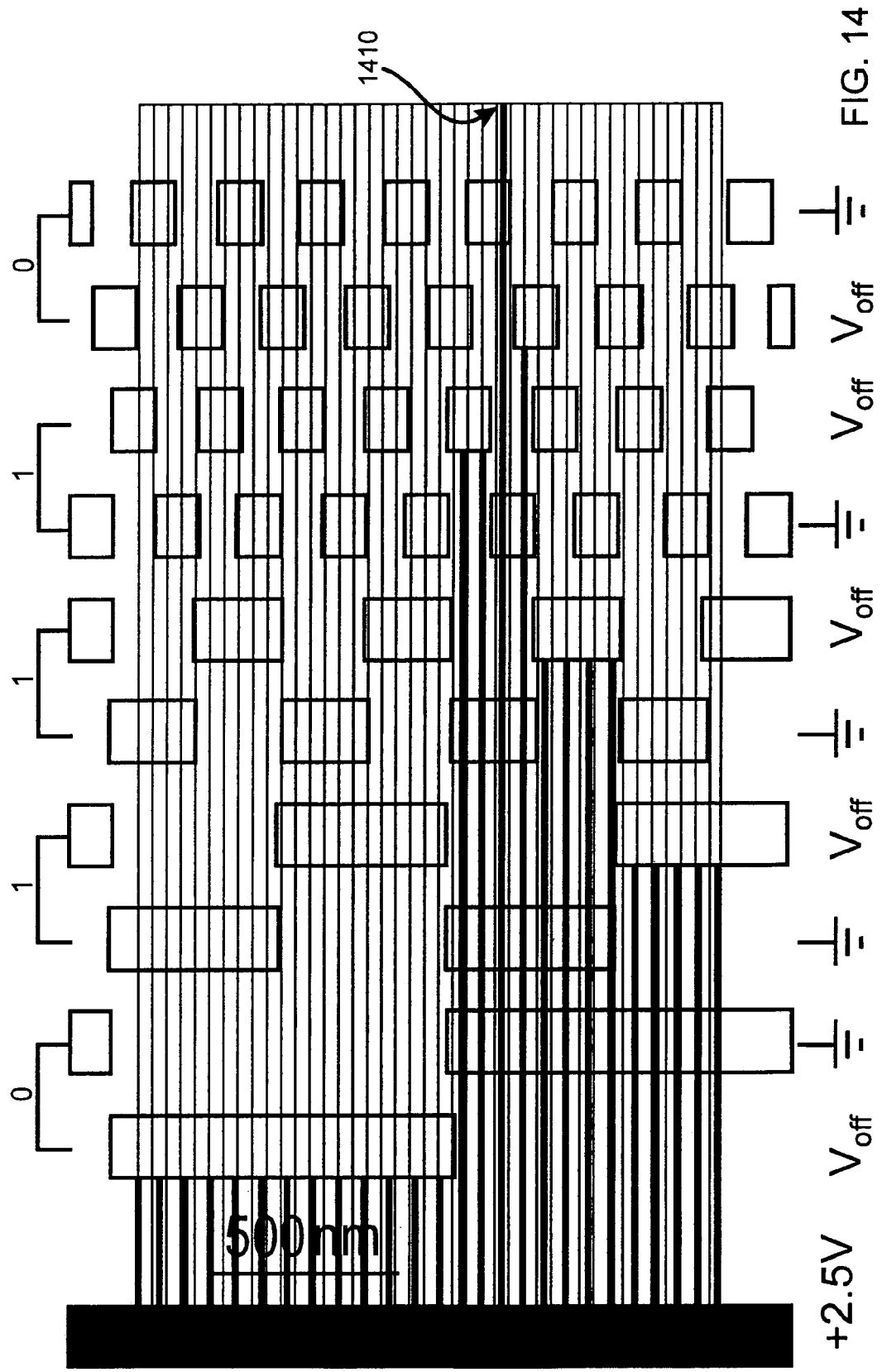
FIG. 14 is a simplified method for addressing nanometer-scale devices according to yet another embodiment of the present invention.

As discussed above and further emphasized here, FIGS. 12 and 13 are merely examples, which should not unduly limit the scope of the present invention. One of ordinary skill in the art would recognize many variations, alternatives, and modifications. In one embodiment, the voltage applied to each address line may be adjusted in order to select and/or address an arbitrary nanowire. For example, for each pair of address lines, one address line is biased to the turn-on voltage and the other is biased to the turn-off voltage. In another embodiment, the voltage applied to each address line may be adjusted in order to select more than one nanowire. For example, for at least one pair of address lines, both address lines are biased to the turn-on voltage or to the turn-off voltage. In yet another embodiment, the nanowire selected and/or addressed may be the only wire in the high resistivity state. In yet another embodiment, the number of nanowires and the number of address lines may vary. FIG. 14 is a simplified method for addressing nanometer-scale devices according to yet another embodiment of the present invention. The diagram is merely an example, which should not unduly limit the scope of the present invention. One of ordinary skill in the art would recognize many variations, alternatives, and modifications. As shown in FIG. 14, a nanowire 1410 is selected. Additionally, the nanowire 1410 has an address of 01110.

According to yet another embodiment, a method for selecting one wire from a plurality of wires includes providing a system including a plurality of semiconductor wires and a plurality of address lines, applying a first voltage to the plurality of semiconductor wires, applying a second voltage to a first half of the plurality of address lines, and applying a third voltage to a second half of the plurality of address lines. Additionally, the method includes obtaining a plurality of currents associated with the plurality of semiconductor wires related to the second voltage and the third voltage, processing information associated with the plurality of currents, and determining a first semiconductor wire based on information associated with the plurality of currents. Two adjacent semiconductor wires of the plurality of semiconductor wires are associated with a separation smaller than or equal to 100 nm. Each of the plurality of address lines intersects the plurality of semiconductor wires at a plurality of intersections. At each of the plurality of intersections, the each of the plurality of address lines is separated from a corresponding semiconductor wire of the plurality of semiconductor wires by a dielectric layer.

Measurements

Figure 15:
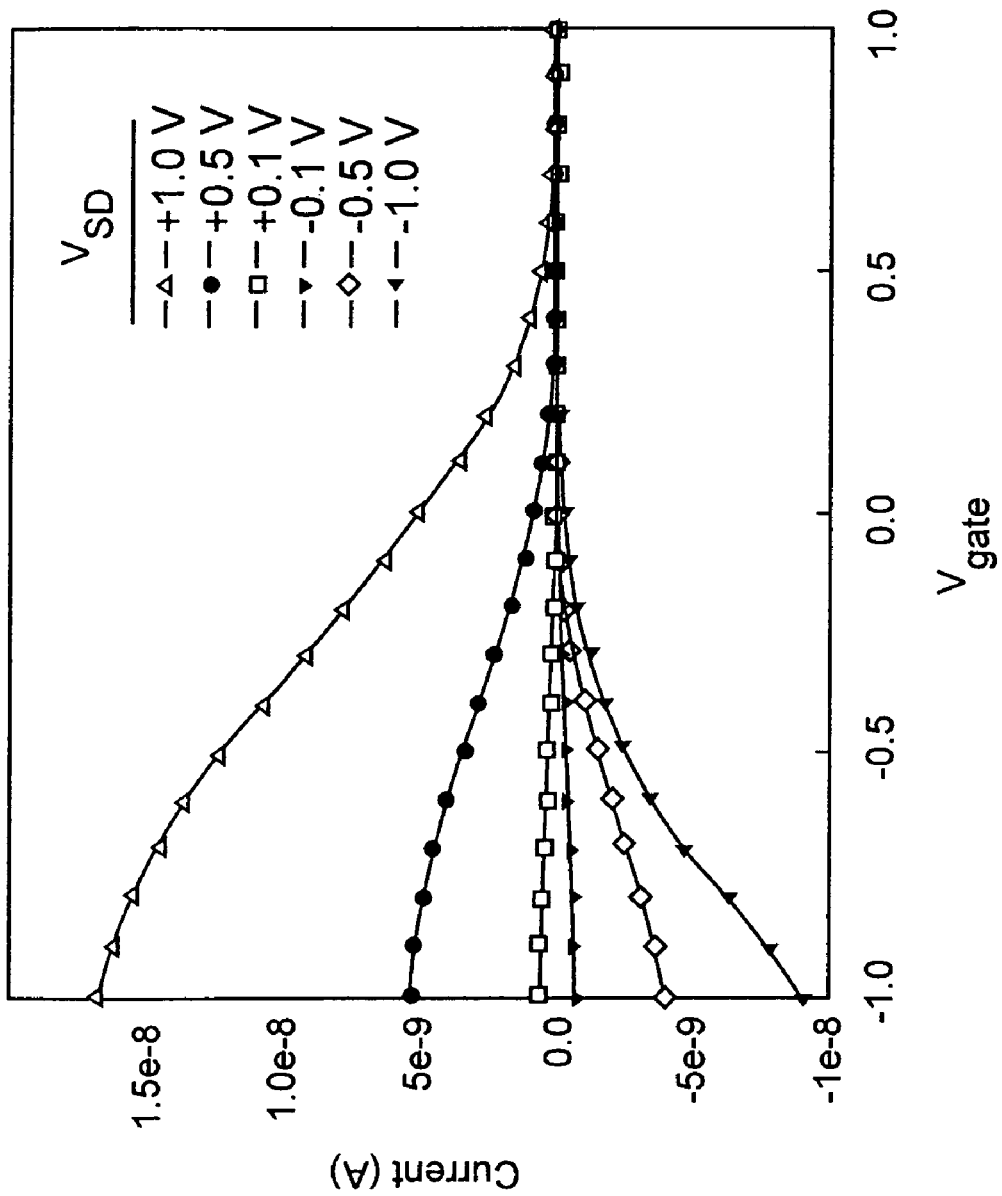
FIG. 15 is a simplified diagram showing current as a function of gate voltage according to an embodiment of the present invention.

Some experiments have been performed using the system for addressing devices as shown in FIG. 4. FIG. 15 is a simplified diagram showing current as a function of gate voltage according to an embodiment of the present invention. The diagram is merely an example, which should not unduly limit the scope of the present invention. One of ordinary skill in the art would recognize many variations, alternatives, and modifications. In certain experiments, the signal wires 424 and 426 are made of silicon with a p-type doping level of $10^{18}/cm^3$, and each has a diameter of 20 nm and a length of 7.5 μm. As shown in FIG. 15, a signal wire such as the signal wire 424 or 426 has been tested for various gate voltages and various source-drain voltages. With an increase in gate voltage, the current decreases and hence the resistivity increases significantly. The gate voltages have been measured with respect to a ground level, and the nanowire segments under the gate region may have a voltage level higher or lower than zero.

Figure 16:
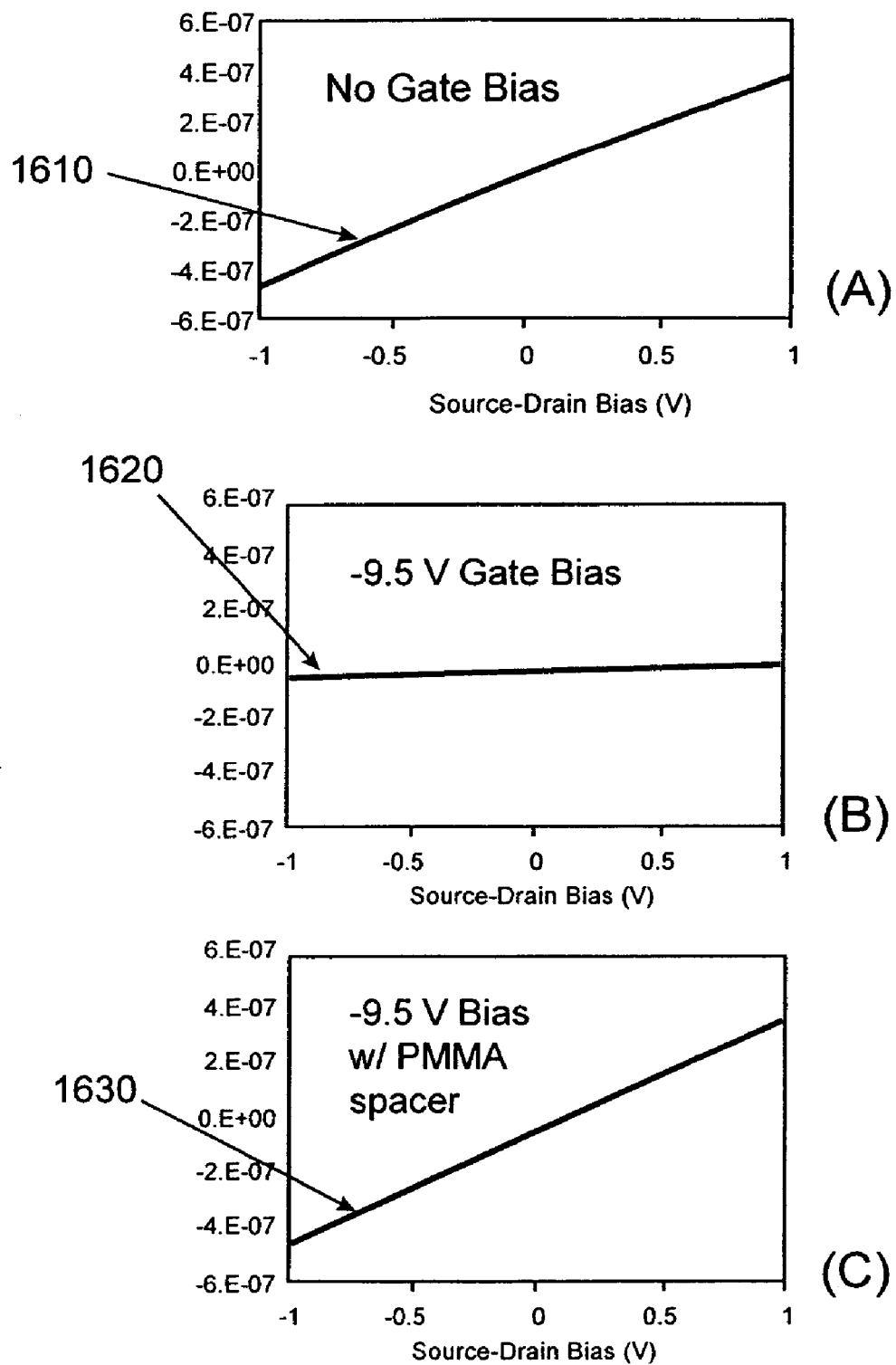
FIGS. 16A, 16B, and 16C are simplified diagrams showing current as a function of source-drain voltage according to an embodiment of the present invention.

Other experiments have been performed using the system for addressing devices as shown in FIG. 4B. FIGS. 16A, 16B, and 16C are simplified diagrams showing current as a function of source-drain voltage according to an embodiment of the present invention. These diagrams are merely examples, which should not unduly limit the scope of the present invention. One of ordinary skill in the art would recognize many variations, alternatives, and modifications. In certain experiments, the signal wires 4220, 4240, and 4280 are made of polysilicon with p-type doping, the dielectric layer 4400 is made of PMMA, and the gate electrode is made of platinum. As shown in FIG. 16A, a signal wire such as the signal wire 4220, 4240, or 4280 has been tested with no gate bias applied. The current flowing through the signal wire increases significantly with the source-drain voltage. As shown by curve 1610, the signal wire exhibits low resistivity. As shown in FIG. 16B, a signal wire such as the signal wire 4240 has been tested with a gate bias of −9.5 volts. The current flowing through the signal wire does not increase significantly with the source-drain voltage. As shown by curve 1620, the signal wire exhibits high resistivity. As shown in FIG. 16C, a signal wire such as the signal wire 4220 or 4280 has been tested with a gate bias of −9.5 volts. The current flowing through the signal wire increases significantly with the source-drain voltage. As shown by curve 1630, the signal wire still exhibits low resistivity not substantially affected by the application of a gate bias. In FIGS. 16A, 16B, and 16C, the gate voltages have been measured with respect to a ground level, and the nanowire segments under the gate region may have a voltage level higher or lower than zero.

The present invention has various advantages. Some embodiments of the present invention provide a system and method for matching the nanometer-dimension patterning techniques and lithographic patterning techniques and for addressing each of the individual nanostructures. For example, the lithographic patterning techniques may use an optical beam such as in the ultraviolet range or the far-ultraviolet range or use an electron beam. Certain embodiments of the present invention can select and address a signal wire whose cross-section area is smaller than the resolution of lithographic techniques. Some embodiments of the present invention can select and address a signal wire from a plurality of signal wires, whose pitch is smaller than the resolution of lithographic techniques.

Certain embodiments of the present invention improves the density of an addressing system. The addressing structures patterned with lithographic techniques usually has a density lower than that of the nanostructures. For example, the addressing structures include address lines with gate regions and inactive regions. To improve overall density, it is desirable to reduce the number of addressing structures for a given number of nanostructures. For example, $_2n$ nanostructures can be individually addressed by approximately n or 2×n addressing lines. n is a positive integer. Some embodiments of the present invention improve tolerance of manufacturing defects. The addressing system does not require manufacturing precision at the level of nanowires. For example, the addressing lines are much larger and spaced farther apart than the nanometer-scale wires. In another example, the spacing between the gate regions of the addressing lines is much larger than the spacing between the nanowires. In yet another example, the smallest gate region covers more than one nanowire.

Some embodiments of the present invention significantly increase the ease of fabrication. A predetermined registration is not required between a given gain region and a give nanowire. For example, the pattern of gain regions for an addressing line continues beyond the edges of the array of nanowires. Certain embodiments of the present invention reduce power consumption. Field effect transistors formed between the gate regions and the nanowires usually do not allow substantial electrical current between the addressing lines and the nanowires except limited leakage current. The reduction in power consumption also reduces heat generation. Additionally, the field effect transistors can serve as gain elements. Some embodiments of the present invention provides an addressing system and method for a large number of nanometer-scale devices without consuming an unacceptable level of power. Certain embodiments of the present invention can bring a nanowire to high resistivity state and low resistivity state depending upon applied gate voltage. Certain embodiments of the present invention improve etching selectivity between $SiO_2$ and Si. The etching rate of $SiO_2$ is much higher than that of Si. Some embodiments of the present invention can select and address an array of semiconductor wires on an insulating substrate.

What is claimed is:

1. A system for selecting one wire from a plurality of wires, the system comprising:
    a plurality of semiconductor wires, two adjacent semiconductor wires of the plurality of semiconductor wires being associated with a separation smaller than or equal to 100 nm;
    a plurality of address lines, each of the plurality of address lines including a gate region and an inactive region and intersecting the plurality of semiconductor wires at a plurality of intersections;
    wherein the plurality of intersections includes a first intersection and second intersection, the first intersection associated with the gate region, the second intersection associated with the inactive region;
    wherein at the first intersection the each of the plurality of address lines is separated from a first semiconductor wire by a first dielectric layer, and at the second intersection the each of the plurality of address lines is separated from a second semiconductor wire by a second dielectric layer;
    wherein the each of the plurality of address lines is free from any gate region associated with a dimension smaller than the separation, the dimension being related to a first direction of the each of the plurality of address lines.

2. The system of claim 1 wherein the each of the plurality of address lines is free from any inactive region associated with a dimension smaller than the separation, the dimension being related to a second direction of the each of the plurality of semiconductor wires.

3. The system of claim 2 wherein the second intersection include the second dielectric layer and a third dielectric layer;
    wherein the first dielectric layer is associated with a first dielectric constant, and the third dielectric layer is associated with a second dielectric constant;
    wherein the first dielectric constant is larger than the second dielectric constant.

4. The system of claim 3 wherein the first dielectric layer comprises at least one selected from a group consisting of $Al_2O_3$, $HfO_2$, and $ZrO_2$.

5. The system of claim 4 wherein the third dielectric layer comprises at least one selected from a group consisting of $SiO_2$ and PMMA.

6. The system of claim 5 wherein the first dielectric layer comprises $Al_2O_3$ and the third dielectric layer comprises $SiO_2$.

7. The system of claim 1 wherein the plurality of semiconductor wires comprises at least one selected from a group consisting of silicon, germanium, and gallium arsenide.

8. The system of claim 7 wherein the plurality of semiconductor wires comprises silicon.

9. The system of claim 8 wherein the silicon is either p-type or n-type.

10. The system of claim 1 wherein the plurality of address lines comprises at least one selected from a group consisting of titanium, aluminum, platinum, copper, and gold.

11. The system of claim 1 wherein the each of the plurality of address lines is free from any gate region associated with a dimension smaller than two times the separation, the dimension being related to the first direction of the each of the plurality of semiconductor wires.

12. The system of claim 1 wherein the each of the plurality of address lines is capable being biased to a first predetermined voltage level and a second predetermined voltage level;
    wherein the first semiconductor wire is associated with a first change in resistivity related to the first predetermined voltage level and the second predetermined voltage level;
    wherein the second semiconductor wire is associated with a second change in resistivity related to the first predetermined voltage level and the second predetermined voltage level;
    wherein the first change associated with the gate region is larger than the second change associated with the inactive region.

13. The system of claim 12 wherein the first change equal to the second change multiplied by a ratio, the ratio ranging from 2 to 100.

14. The system of claim 12 wherein the plurality of address lines are capable of selecting a third semiconductor wire from the plurality of semiconductor wires;
    wherein the third semiconductor wire is associated with a resistivity value lower than any other semiconductor wire of the plurality of semiconductor wires.

15. The system of claim 12 wherein the plurality of address lines are capable of selecting a third semiconductor wire from the plurality of semiconductor wires;
    wherein the third semiconductor wire is associated with a resistivity value higher than any other semiconductor wire of the plurality of semiconductor wires.

* * * * *